United States Patent
Nii et al.

(10) Patent No.: US 10,706,917 B2
(45) Date of Patent: Jul. 7, 2020

(54) SEMICONDUCTOR MEMORY DEVICE

(71) Applicant: RENESAS ELECTRONICS CORPORATION, Tokyo (JP)

(72) Inventors: Koji Nii, Tokyo (JP); Yuichiro Ishii, Tokyo (JP); Yohei Sawada, Tokyo (JP); Makoto Yabuuchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/176,299

(22) Filed: Oct. 31, 2018

(65) Prior Publication Data
US 2019/0189197 A1    Jun. 20, 2019

(30) Foreign Application Priority Data

Dec. 20, 2017    (JP) ................. 2017-243989

(51) Int. Cl.
| | | |
|---|---|---|
| G11C 11/00 | (2006.01) | |
| G11C 11/419 | (2006.01) | |
| G11C 11/412 | (2006.01) | |
| G11C 7/12 | (2006.01) | |

(52) U.S. Cl.
CPC .......... G11C 11/419 (2013.01); G11C 11/412 (2013.01); *G11C 7/12* (2013.01)

(58) Field of Classification Search
CPC ....... G11C 7/12; G11C 11/412; G11C 11/413; G11C 11/419
See application file for complete search history.

(56) References Cited

U.S. PATENT DOCUMENTS

| | | | |
|---|---|---|---|
| 7,379,347 B1 | 5/2008 | Nautiyal | |
| 7,952,911 B2 | 5/2011 | Lee et al. | |
| 10,236,055 B1* | 3/2019 | Kumar | G11C 11/419 |
| 2015/0023086 A1* | 1/2015 | Wendell | G11C 11/412 |
| | | | 365/72 |
| 2016/0181255 A1* | 6/2016 | Nii | H01L 27/1104 |
| | | | 257/369 |
| 2016/0240246 A1* | 8/2016 | Sano | G11C 11/419 |
| 2017/0194046 A1* | 7/2017 | Yeung, Jr. | G11C 11/418 |
| 2018/0294018 A1* | 10/2018 | Baeck | G11C 7/1096 |

* cited by examiner

*Primary Examiner* — Toan K Le
(74) *Attorney, Agent, or Firm* — McDermott Will & Emery LLP

(57) ABSTRACT

Provided is a semiconductor memory device having a low power consumption write assist circuit. The semiconductor memory device includes multiple word lines, multiple bit line pairs, multiple memory cells, multiple auxiliary line pairs, a write driver circuit, a write assist circuit, and a select circuit. The memory cells are coupled to the word lines and the bit line pairs in such a manner that one memory cell is coupled to one word line and one bit line pair. The auxiliary line pairs run parallel to the bit line pairs in such a manner that one auxiliary line pair runs parallel to one bit line pair. The select circuit couples, to the write driver circuit, one bit line pair selected from the bit line pairs in accordance with a select signal, and couples, to the write assist circuit, an associated auxiliary line pair running parallel to the selected bit line pair.

11 Claims, 13 Drawing Sheets

SEMICONDUCTOR MEMORY DEVICE

CROSS-REFERENCE TO RELATED APPLICATIONS

The disclosure of Japanese Patent Application No. 2017-243989 filed on Dec. 20, 2017 including the specification, drawings, and abstract is incorporated herein by reference in its entirety.

BACKGROUND

The present invention relates to a semiconductor memory device. More particularly, the present invention is applicable to a semiconductor memory device having a write assist circuit and to a semiconductor device including such a semiconductor memory device.

Some semiconductor devices include a volatile semiconductor memory device such as a static random access memory (SRAM). For SRAMs generated by a miniaturized semiconductor process, a negative-bias write assist technology is proposed (refer to U.S. Pat. Nos. 7,379,347 and 7,952,911). In order to secure a write margin, the negative-bias write assist technology drives one line of a bit line pair to a negative bias not higher than a ground potential (0 V) during a write operation. The negative-bias write assist technology improves the drive capability of a select transistor coupled to a selection-level word line and a negatively-biased bit line. Therefore, even if a memory cell is formed of a miniaturized transistor, its write margin can be adequately secured by the negative-bias write assist technology.

SUMMARY

The inventors of the present invention have studied the negative-bias write assist technology with a view toward further reducing the power consumption of the write assist circuit and decreasing the area of a SRAM including the write assist circuit. When the capacitance to be driven is large, the power consumption of the write assist circuit increases.

The present invention has been made to provide a semiconductor memory device having a low power consumption write assist circuit.

Other advantages and novel features will become apparent from the following description and from the accompanying drawings.

A representative aspect of the present invention disclosed in this document is briefly summarized below.

According to the representative aspect of the present invention, there is provided a semiconductor memory device including multiple word lines, multiple bit line pairs, multiple memory cells, multiple auxiliary line pairs, a write driver circuit, a write assist circuit, and a select circuit. The memory cells are coupled to the word lines and the bit line pairs in such a manner that one memory cell is coupled to one word line and one bit line pair. The auxiliary line pairs run parallel to the bit line pairs in such a manner that one auxiliary line pair runs parallel to one bit line pair. The select circuit couples, to the write driver circuit, one bit line pair selected from the bit line pairs in accordance with a select signal, and couples, to the write assist circuit, an associated auxiliary line pair running parallel to the selected bit line pair.

The semiconductor memory device described above is able to reduce the power consumption of the write assist circuit.

DETAILED DESCRIPTION

Figure 1:
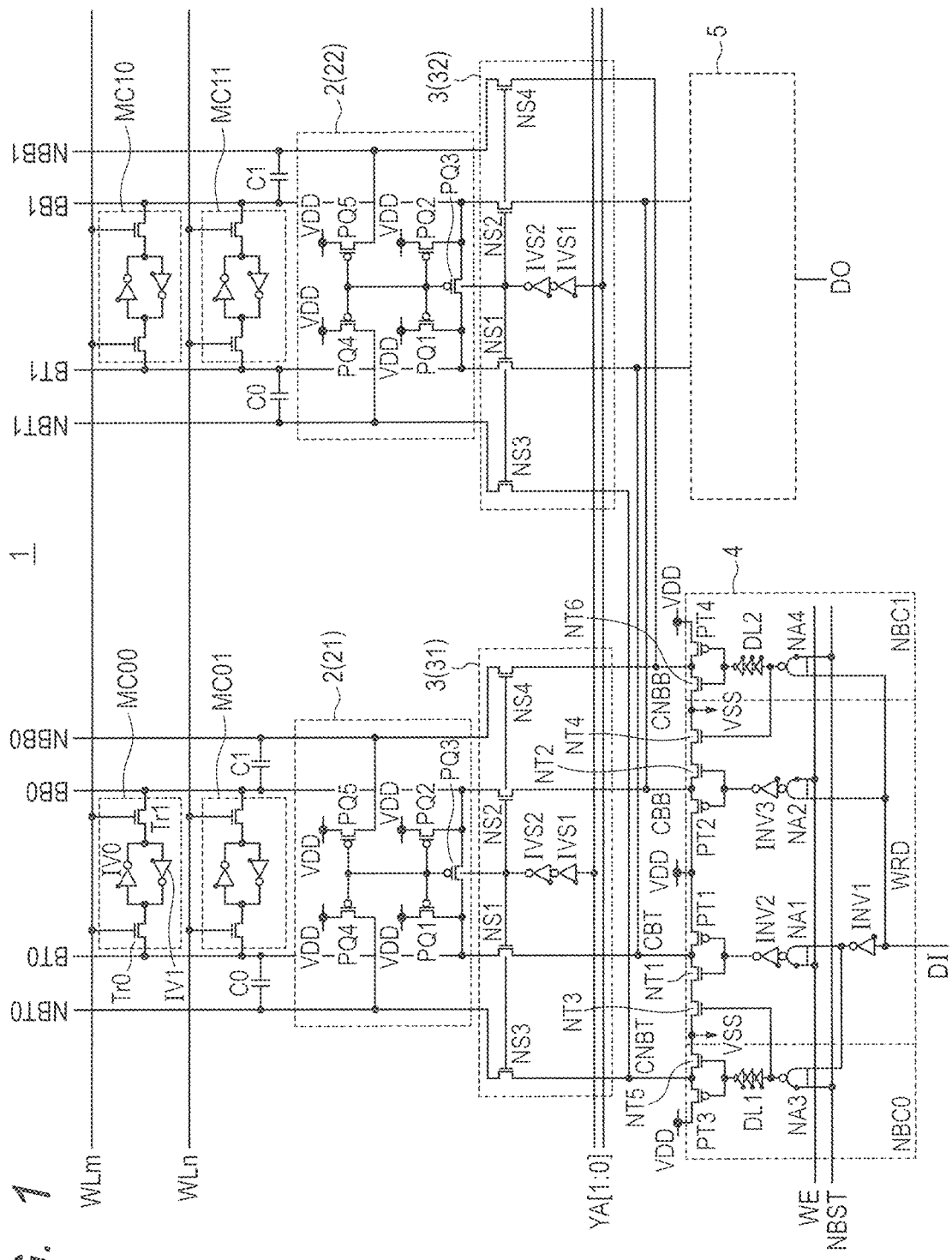
FIG. 1 is a diagram illustrating a semiconductor memory device according to a first embodiment of the present invention.

Embodiments and an application example will now be described with reference to the accompanying drawings. In the following description, like elements are designated by like reference numerals and may not be redundantly described. For clarity of explanation, the drawings are schematically made so that they may not precisely represent, for example, actual width, thickness, and shape of each section. The drawings are merely illustrative and do not limit the interpretation of the present invention.

First Embodiment

FIG. 1 is a diagram illustrating a semiconductor memory device according to a first embodiment of the present invention. The semiconductor memory device 1 is a volatile semiconductor memory device such as a static random-access memory (SRAM). The semiconductor memory device 1 includes multiple word lines (WLn, WLm), multiple bit line pairs (BT0, BB0, BT1, BB1), and multiple auxiliary line pairs (NBT0, NBB0, NBT1, NBB1).

Multiple memory cells (MC00, MC01, MC10, MC11) arranged in matrix form are coupled to the word lines (WLn, WLm) and the bit line pairs (BT0, BB0, BT1, BB1) in such a manner that one memory cell is coupled to one word line (WLn or WLm) and one bit line pair (BT0 and BB0 or BT1 and BB1).

The auxiliary line pairs (NBT0, NBB0, NBT1, NBB1) run parallel to the bit line pairs (BT0, BB0, BT1, BB1) in such a manner that one auxiliary line pair (NBT0 and NBB0 or NBT1 and NBB1) runs parallel to one bit line pair (BT0 and BB0 or BT1 and BB1).

FIG. 1 depicts a first memory column to be selected by a column select signal YA0 and a second memory column to be selected by a column select signal YA1. The first memory column has single-port memory cells MC00, MC01, which are indicated as representatives. The second memory column has single-port memory cells MC10, MC11, which are indicated as representatives.

When the word lines (WLn, WLm) are formed by a first metal wiring layer, the bit line pairs (BT0, BB0, BT1, BB1) and the auxiliary line pairs (NBT0, NBB0, NBT1, NBB1) are formed by a second metal wiring layer in a direction crossing the word lines (WLn, WLm). When the bit line pairs (BT0, BB0, BT1, BB1) and the auxiliary line pairs (NBT0, NBB0, NBT1, NBB1) are formed by the first metal wiring layer, the word lines (WLn, WLm) are formed by the second metal wiring layer in a direction crossing the bit line pairs (BT0, BB0, BT1, BB1) and the auxiliary line pairs (NBT0, NBB0, NBT1, NBB1).

Each of the memory cells (MC00, MC01, MC10, MC11) is a single-port SRAM memory cell having six transistors (6 T SP-SRAM cell). As exemplified by the memory cell MC00, the memory cells (MC00, MC01, MC10, MC11) each include first and second inverter circuits IV0, IV1 and transfer NMOS transistors Tr0, Tr1. The first and second inverter circuits IV0, IV1 are configured so that their inputs and outputs are cross-coupled to each other to form a flip-flop for storing information. The first and second inverter circuits IV0, IV1 are respectively formed of a PMOS transistor and an NMOS transistor. The source-drain path of the transfer NMOS transistor Tr0 is coupled between the bit line BT0, which is one of the pair of bit lines (BT0, BB0), and the input of the first inverter circuit IV0 or the output of the second inverter circuit IV1. The gate electrode of the transfer NMOS transistor Tr0 is coupled to the associated word line WLm. The source-drain path of the transfer NMOS transistor Tr1 is coupled between the bit line BB0, which is the other one of the pair of bit lines (BT0, BB0), and the output of the first inverter circuit IV0 or the input of the second inverter circuit IV1. The gate electrode of the transfer NMOS transistor Tr1 is coupled to the associated word line WLm. The PMOS transistor is a P-channel MOSFET, and the NMOS transistor is an N-channel MOSFET.

Similarly, the memory cell MC01 is coupled to the pair of bit lines BT0, BB0 and the word line WLn. The memory cell MC10 is coupled to the pair of bit lines BT1, BB1 and the word line WLm. The memory cell MC11 is coupled to the pair of bit lines BT1, BB1 and the word line WLn.

The pair of auxiliary lines NBT0, NBB0 runs parallel to the pair of bit lines BT0, BB0 so that the pair of auxiliary lines NBT0, NBB0 and the pair of bit lines BT0, BB0 are disposed in parallel. The pair of auxiliary lines NBT1, NBB1 runs parallel to the pair of bit lines BT1, BB1 so that the pair of auxiliary lines NBT1, NBB1 and the pair of bit lines BT1, BB1 are disposed in parallel. Therefore, parasitic capacitance C0 exists between the auxiliary line NBT0 and the bit line BT0, and parasitic capacitance C1 exists between the auxiliary line NBB0 and the bit line BB0. Similarly, the parasitic capacitance C0 exists between the auxiliary line NBT1 and the bit line BT1, and the parasitic capacitance C1 exists between the auxiliary line NBB1 and the bit line BB1. The parasitic capacitance C0 and the parasitic capacitance C1 are capacitive elements for generating a negative bias. The pairs of auxiliary lines NBT0, NBB0, NBT1, NBB1 may be regarded as the wiring for forming a capacitive element for generating a negative bias. In this document, the term "running parallel" indicates that two wires are spaced at a predetermined interval, oriented in the same direction, and disposed in parallel.

A precharge circuit 2 includes a precharge circuit 21 and a precharge circuit 22. The precharge circuit 21 precharges the pair of bit lines BT0, BB0 and the pair of auxiliary lines NBT0, NBB0. The precharge circuit 22 precharges the pair of bit lines BT1, BB1 and the pair of auxiliary lines NBT1, NBB1. The precharge circuit 21 and the precharge circuit 22 have the same configuration. Therefore, the precharge circuit 21 is described below as a representative, and the description of the precharge circuit 22 is omitted.

The precharge circuit 21 includes PMOS transistors PQ1, PQ2, PQ3. The PMOS transistors PQ1, PQ2 act as a precharge transistor for precharging the pair of bit lines BT0, BB0 to a first reference potential such as a power supply potential VDD. The PMOS transistor PQ3 acts as an equalize transistor for equalizing the potential between the pair of bit lines BT0, BB0. The source-drain path of the PMOS transistor PQ1 is coupled between the bit line BT0 and the wire to which the power supply potential VDD is supplied. The source-drain path of the PMOS transistor PQ2 is coupled between the bit line BB0 and the wire to which the power supply potential VDD is supplied. The source-drain path of the PMOS transistor PQ3 is coupled between the bit line BT0 and the bit line BB0. The gates of the PMOS transistors PQ1, PQ2, PQ3 are coupled in a shared manner so as to receive the column select signal YA0 through inverter circuits IVS1, IVS2 of a column select circuit 31 as described later.

The precharge circuit 21 further includes PMOS transistors PQ4, PQ5. The PMOS transistors PQ4, PQ5 act as a precharge transistor for precharging the pair of auxiliary lines NBT0, NBB0 to the first reference potential such as the power supply potential VDD. The source-drain path of the PMOS transistor PQ4 is coupled between the auxiliary line NBT0 and the wire to which the power supply potential VDD is supplied. The source-drain path of the PMOS transistor PQ5 is coupled between the auxiliary line NBB0 and the wire to which the power supply potential VDD is supplied. The gates of the PMOS transistors PQ4, PQ5 are coupled in a shared manner so as to receive the later-described column select signal YA0 through the inverter circuits IVS1, IVS2.

It should be noted that the precharge circuit 22 receives the column select signal YA1 through the inverter circuits IVS1, IVS2 of a column select circuit 32 as described later.

A column select circuit 3 includes the column select circuit 31 and the column select circuit 32. The column select circuit 31 couples the pair of bit lines BT0, BB0 and the pair of auxiliary lines NBT0, NBB0 to a write circuit 4 in accordance with the selection level of the column select signal YA0 of column select signals (column address signal and Y address signal) YA[1:0]. The column select circuit 32 couples the pair of bit lines BT1, BB1 and the pair of auxiliary lines NBT1, NBB1 to the write circuit 4 in accordance with the selection level of the column select signal YA1 of the column select signals YA[1:0].

The column select circuit 31 includes the inverter circuits IVS1, IVS2 and NMOS transistors NS1, NS2, NS3, NS4. The NMOS transistors NS1, NS2, NS3, NS4 act as a select transistor. The NMOS transistors NS1, NS2 are included to select the pair of bit lines BT0, BB0, and the NMOS transistors NS3, NS4 are included to select the pair of auxiliary lines NBT0, NBB0. The column select signal YA0 is supplied to the commonly coupled gates of the NMOS transistors NS1, NS2, NS3, NS4 through the inverter circuits IVS1, IVS2. The source-drain paths of the NMOS transistors NS1, NS2 are coupled between the pair of bit lines BT0, BB0 and a pair of common bit lines CBT, CBB. The source-drain paths of the NMOS transistors NS3, NS4 are coupled between the pair of auxiliary lines NBT0, NBB0 and a pair of common auxiliary lines CNBT, CNBB.

The column select circuit 32 is similar in circuit configuration to the column select circuit 31. However, the column select circuit 32 differs from the column select circuit 31 in that column select signal YA1 is supplied to the commonly coupled gates of the NMOS transistors NS1, NS2, NS3, NS4 through the inverter circuits IVS1, IVS2. Further, in the column select circuit 32, the source-drain paths of the NMOS transistors NS1, NS2 are coupled between the pair of bit lines BT1, BB1 and the pair of common bit lines CBT, CBB, and the source-drain paths of the NMOS transistors NS3, NS4 are coupled between the pair of auxiliary lines NBT1, NBB1 and the pair of common auxiliary lines CNBT, CNBB.

The write circuit 4 includes a write driver circuit WRD and first and second write assist circuits NBC0, NBC1. The first and second write assist circuits NBC0, NBC1 can be regarded as auxiliary line drive circuits. The write driver circuit WRD supplies data, which is supplied to a data input terminal DI, to a pair of bit lines (BT0 and BB0 or BT1 and BB1) selected through the common bit lines CBT, CBB. The first and second write assist circuits NBC0, NBC1 are included to change the potential of an auxiliary line (NBT0, NBB0, NBT1, or NBB1), which runs parallel to a bit line (BT0, BB0, BT1, or BB1) that is one of a selected pair of bit lines and placed at a low level in accordance with data supplied to the data input terminal DI, from the first reference potential VDD to a second reference potential VSS.

The write driver circuit WRD includes inverter circuits INV1, INV2, INV3, NAND circuits NA1, NA2, PMOS transistors PT1, PT2, and NMOS transistors NT1, NT2, NT3, NT4. The input of the inverter circuit INV1 and one input of the NAND circuit NA2 are coupled to the data input terminal DI. The output of the inverter circuit INV1 is coupled to one input of the NAND circuit NA1, and the other inputs of the NAND circuits NA1, NA2 receive a write enable signal WE. The output of the NAND circuit NA1 is supplied to the gate of the PMOS transistor PT1 and the gate of the NMOS transistor NT1 through the inverter circuit INV2. The source-drain path of the PMOS transistor PT1 and the source-drain paths of the NMOS transistors NT1, NT3 are directly coupled between the power supply potential VDD and a ground potential VSS. The coupling node of the PMOS transistor PT1 and NMOS transistor NT1 is coupled to one of the pair of common bit lines CBT, CBB (common bit line CBT). The output of the NAND circuit NA2 is supplied to the gate of the PMOS transistor PT2 and the gate of the NMOS transistor NT2 through the inverter circuit INV3. The source-drain path of the PMOS transistor PT2 and the source-drain paths of the NMOS transistors NT2, NT4 are directly coupled between the power supply potential VDD and the ground potential VSS. The coupling node of the PMOS transistor PT2 and NMOS transistor NT2 is coupled to the other one of the pair of common bit lines CBT, CBB (common bit line CBB).

The first write assist circuit NBC0 includes a NAND circuit NA3, a delay circuit DL1, a PMOS transistor PT3, and an NMOS transistor NT5. The delay circuit DL1 is formed of three inverter circuits. One input of the NAND circuit NA3 receives a negative-bias assist signal NBST, and the other input of the NAND circuit NA3 is coupled to the output of the inverter circuit INV1. The output of the NAND circuit NA3 is supplied to the gate of the PMOS transistor PT3 and the gate of the NMOS transistor NT5 through the delay circuit DL1. The source-drain path of the PMOS transistor PT3 and the source-drain path of the NMOS transistor NT5 are directly coupled between the power supply potential VDD and the ground potential VSS. Further, the output of the NAND circuit NA3 is coupled to the gate of the NMOS transistor NT3.

The second write assist circuit NBC1 includes a NAND circuit NA4, a delay circuit DL2, a PMOS transistor PT4, and an NMOS transistor NT6. The delay circuit DL2 is formed of three inverter circuits. One input of the NAND circuit NA4 receives the negative-bias assist signal NBST, and the other input of the NAND circuit NA4 is coupled to the data input terminal DI. The output of the NAND circuit NA4 is supplied to the gate of the PMOS transistor PT4 and the gate of the NMOS transistor NT6 through the delay circuit DL2. The source-drain path of the PMOS transistor PT4 and the source-drain path of the NMOS transistor NT6 are directly coupled between the power supply potential VDD and the ground potential VSS. Further, the output of the NAND circuit NA4 is coupled to the gate of the NMOS transistor NT4.

A readout circuit 5 is coupled to the pair of common bit lines CBT, CBB, receives the data of a memory cell selected by a word line (WLn or WLm) through a pair of bit lines (BT0 and BB0 or BT1 and BB1) selected by the column select signals YA[1:0] and the pair of common bit lines CBT, CBB, amplifies the received data, and outputs the amplified data to a data output terminal DO. The circuit configuration of the readout circuit 5 is not specifically described here. However, the readout circuit 5 may be formed of a well-known sense amplifier circuit such as a differential amplifier or a flip-flop. Further, the data output terminal DO and the data input terminal DI may be integrated into a single terminal (DIO).

Figure 2:
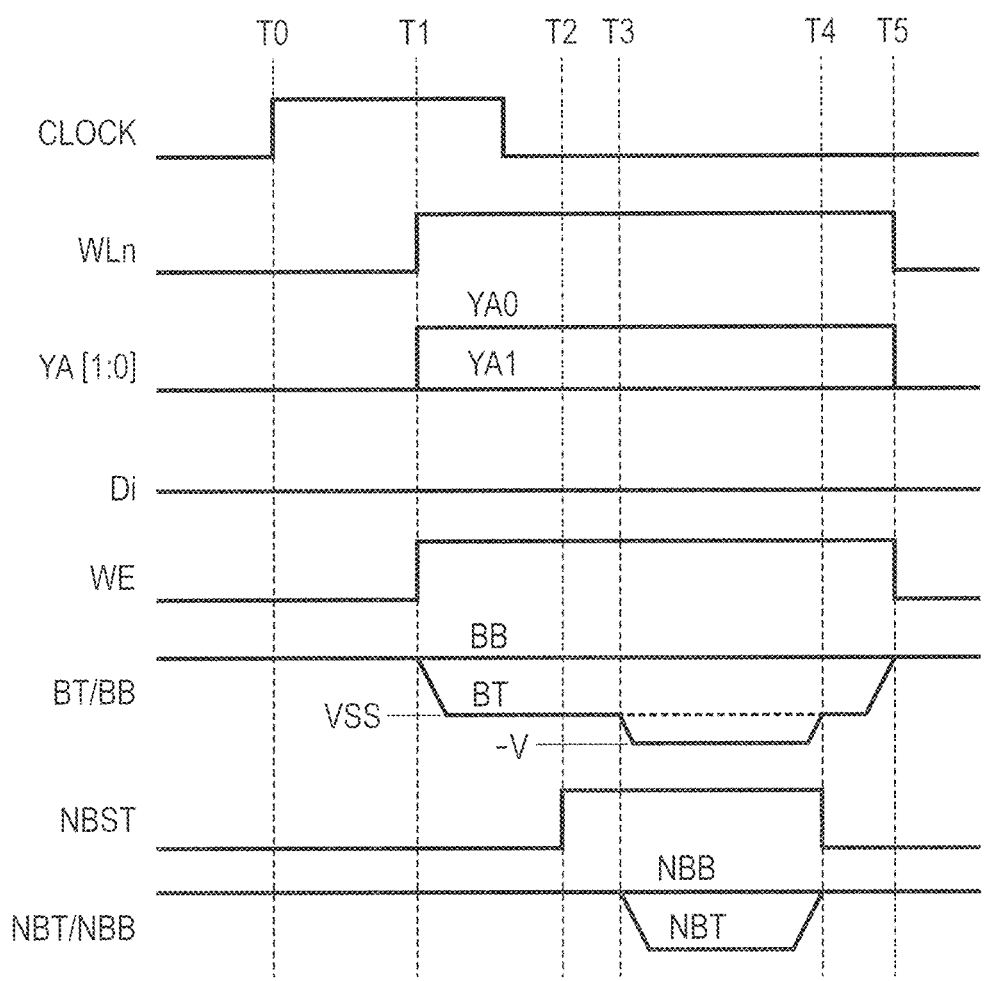
FIG. 2 is a timing diagram illustrating the operations of the semiconductor memory device according to the first embodiment.

FIG. 2 is a timing diagram illustrating the operations of the semiconductor memory device according to the first embodiment.

First of all, a clock signal CLOCK rises at time T0. This is used as a trigger for selecting one of the word lines WLn, WLm and placing the selected word line at an activation level such as a high level at time T1. Here, it is assumed that the word line WLn is activated to the high level. Further, one of the column select signals YA[1:0] is activated at the same time. Here, it is assumed that the column select signal YA0 is activated to the high level. Furthermore, the write enable signal WE is activated to the high level so that the bit line pair BT0/BB0 is selected and driven.

The level of input data Di at the data input terminal DI determines which bit line (BT0 or BB0) is to be driven to the low level. In the present example, however, it is assumed that the input data Di is at the low level. In this instance, the write driver circuit WRD drives the bit line BT0 to the low level. That is, the PMOS transistor PT1 in the write driver circuit WRD turns off and the NMOS transistors NT1 and NT3 turn on. Therefore, the bit line BT0 is transitioned or driven from a precharge level (high level) to the low level such as the ground potential VSS (0 V). Meanwhile, the PMOS transistor PT2 in the write driver circuit WRD turns on and the NMOS transistors NT2 and NT4 turn off. Therefore, the bit line BB0 remains at the precharge level (high level).

After the lapse of a predetermined period of time, that is, at time T2, the negative-bias assist signal NBST is activated to the high level. This immediately turns off the NMOS transistor NT3 in the write driver circuit WRD, which drives a bit line pair to the low level. Therefore, the source node of the NMOS transistor NT1 is uncoupled from the ground potential VSS. As a result, the bit line BT0, which is driven to the low level, is placed in a high-impedance (high-Z) state or a floating state.

After a fixed delay is introduced by the delay circuit DL1 in the write assist circuit NBC0, the auxiliary line NBT0, which is a wire for configuring a negative-bias generation capacitance, is driven at time T3 from the high level to the low level. The auxiliary line NBB0 remains at the high level. As the input data Di is currently at the low level, the auxiliary line NBT0 is driven to the low level. The parasitic capacitance C0 between BT0 and NBT0 further decreases the voltage of the bit line BT0 in the high-Z state from the low level, such as the ground potential VSS (0 V), to a negative potential not higher than the ground potential VSS or toward a negative bias (−V). This causes data to be written into the memory cell MC01. At time T4, the negative-bias assist signal NBST is deactivated to the low level so that the bit line BT0 is transitioned to the low level such as the ground potential VSS. Further, the auxiliary line NBT0 is precharged to the precharge level such as the high level. Furthermore, at time T5, the write enable signal WE is deactivated to the low level, and the bit line pair BT0/BB0 is precharged by the precharge circuit 21 to the precharge level such as the high level. Moreover, the word line WLn and the column select signal YA0 are also deactivated and transitioned to an initial state such as the low level.

Although not depicted, the following sequence is followed when the input data Di is at the high level. The write driver circuit WRD drives the bit line BB0 to the low level. That is, as the PMOS transistor PT2 in the write driver circuit WRD turns off and the NMOS transistors NT2 and NT4 turn on, the bit line BB0 is transitioned or driven from the precharge level (high level) to the low level such as the ground potential VSS. Meanwhile, as the PMOS transistor PT1 in the write driver circuit WRD turns on and the NMOS transistors NT1, NT3 turn off, the bit line BT0 remains at the precharge level (high level).

After the lapse of a predetermined period of time, that is, at time T2, the negative-bias assist signal NBST is activated to the high level. This immediately turns off the NMOS transistor NT4 in the write driver circuit WRD, which drives a bit line pair to the low level. Therefore, the source node of the NMOS transistor NT2 is uncoupled from the ground potential VSS. As a result, the bit line BB0, which is driven to the low level, is placed in the high-impedance (high-Z) state or the floating state.

After a fixed delay is introduced by the delay circuit DL2 in the write assist circuit NBC1, the auxiliary line NBB0, which is a wire for a negative-bias generation capacitance, is driven at time T3 from the high level to the low level. The auxiliary line NBT0 remains at the high level. As the input data Di is at the high level, the auxiliary line NBB0 is driven to the low level. The parasitic capacitance C1 between BB0 and NBB0 further decreases the voltage of the bit line BB0 in the high-Z state from the low level, such as the ground potential VSS, to a negative potential not higher than the ground potential VSS or toward the negative bias (−V). This causes data to be written into the memory cell MC01. At time T4, the negative-bias assist signal NBST is deactivated so that the bit line BB0 is transitioned to the low level such as the ground potential VSS. Further, the auxiliary line NBB0 is placed at the precharge level such as the high level. Furthermore, at time T5, the write enable signal WE is deactivated, and the bit line pair BT0/BB0 is precharged by the precharge circuit 21 to the precharge level such as the high level. Moreover, the word lines WL and the column select signals YA are also deactivated and transitioned to the initial state such as the low level.

The above description relates to a case where the column select signal YA0 is activated. However, the operation performed by the column select signal YA1 when it is activated can be readily understood by referring to the above description. Therefore, the description of the operation of the column select signal YA1 is omitted.

The first embodiment provides one or more of the following advantageous effects.

1) The pair of auxiliary lines NBT0, NBB0 (NBT1, NBB1) run parallel to the pair of bit lines BT0, BB0 (BT1, BB1). Further, the column select circuit 31 (32) is provided to select the pair of bit lines BT0, BB0 (BT1, BB1) and the pair of auxiliary lines NBT0, NBB0 (NBT1, NBB1) by using the column select signals (Y address signal) YA[1:0]. This enables the write assist circuits NBC0, NBC1 to drive the parasitic capacitance C0 between the bit line pair BT0 (BT1) and the auxiliary line pair NBT0 (NBT1) or the parasitic capacitance C1 between the bit line pair BB0 (BB1) and the auxiliary line pair NBB0 (NBB1). Therefore, the drive capabilities of the write assist circuits NBC0, NBC1 can be reduced. This makes it possible to reduce the power consumption of the write assist circuits NBC0, NBC1.

2) Further, as the drive capabilities of the write assist circuits NBC0, NBC1 can be reduced as described in 1) above, the PMOS transistors PT3, PT4 and the NMOS transistors NT5, NT6 can be reduced in size. This makes it possible to reduce the areas of the write assist circuits NBC0, NBC1.

3) Moreover, the advantageous effect described in 2) above makes it possible to reduce the area of the semiconductor memory device having the write assist circuits NBC0, NBC1.

Second Embodiment

Figure 3:
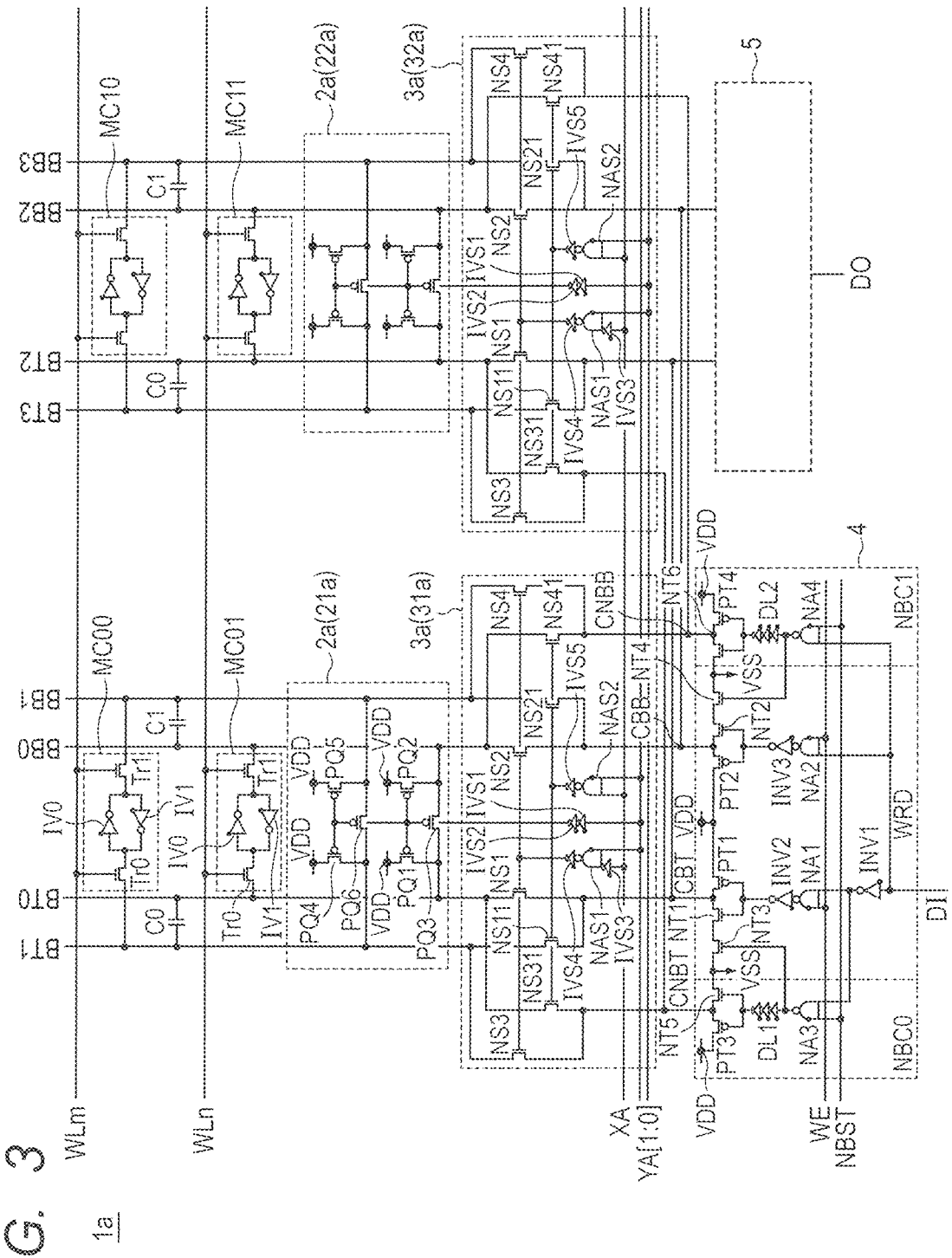
FIG. 3 is a diagram illustrating the semiconductor memory device according to a second embodiment of the present invention.

FIG. 3 is a diagram illustrating the semiconductor memory device according to a second embodiment of the present invention. The first embodiment is configured so that the pair of auxiliary lines NBT0, NBB0 (NBT1, NBB1) runs parallel to the pair of bit lines BT0, BB0 (BT1, BB1). However, the semiconductor memory device 1a according to the second embodiment, which is assumed to be a SRAM, is configured so that the pair of auxiliary lines NBT0, NBB0 (NBT1, NBB1) is not a dedicated auxiliary line pair, but doubles as a bit line pair. That is, the semiconductor memory device 1a according to the second embodiment is configured so that included line pairs perform the functions of both the bit line pairs and the auxiliary line pairs. Having the above-described configuration, the second embodiment provides an advantageous effect of reducing the overall area of the semiconductor memory device in addition to the advantageous effects provided by the first embodiment.

As illustrated in FIG. 3, the semiconductor memory device 1a includes multiple word lines (WLn, WLm) and multiple bit line pairs (BT0, BB0, BT1, BB1, BT2, BB2, BT3, BB3). Multiple memory cells (MC00, MC01, MC10, MC11) arranged in matrix form are coupled to the word lines (WLn, WLm) and the bit line pairs (BT0, BB0, BT1, BB1, BT2, BB2, BT3, BB3) in such a manner that one memory cell is coupled to one word line (WLn or WLm) and one bit line pair (BT0 and BB0, BT1 and BB1, BT2 and BB2, or BT3 and BB3). The bit lines BT0 and BT1 run parallel to each other, and the bit lines BB0 and BB1 run parallel to each other. Similarly, the bit lines BT2 and BT3 run parallel to each other, and the bit lines BB2 and BB3 run parallel to each other.

Consequently, the parasitic capacitance C0 exists between the bit lines BT0 and BT1, and the parasitic capacitance C1 exists between the bit lines BB0 and BB1. Similarly, the parasitic capacitance C0 exists between the bit lines BT2 and BT3, and the parasitic capacitance C1 exists between the bit lines BB2 and BB3. The parasitic capacitance C0 and the parasitic capacitance C1 are capacitive elements for generating a negative bias. The bit lines BT0 and BT1, the bit lines BB0 and BB1, the bit lines BT2 and BT3, and the bit lines BB2 and BB3 may be respectively regarded as a wiring pair (capacitance wiring pair for negative bias generation) for forming a capacitive element for generating a negative bias.

FIG. 3 depicts the first memory column to be selected by the column select signal YA0 and the second memory column to be selected by the column select signal YA1. The first memory column has the single-port memory cells MC00, MC01, which are indicated as representatives. The second memory column has the single-port memory cells MC10, MC11, which are indicated as representatives.

When the word lines (WLn, WLm) are formed by the first metal wiring layer, the bit line pairs (BT0, BB0, BT1, BB1, BT2, BB2, BT3, BB3) are formed by the second metal wiring layer in a direction crossing the word lines (WLn, WLm). When the bit line pairs (BT0, BB0, BT1, BB1, BT2, BB2, BT3, BB3) are formed by the first metal wiring layer, the word lines (WLn, WLm) are formed by the second metal wiring layer in a direction crossing the bit line pairs (BT0, BB0, BT1, BB1, BT2, BB2, BT3, BB3).

The memory cell MC00 is coupled to the word line WLm and the pair of bit lines BT1, BB1, and the memory cell MC01 is coupled to the word line WLn and the pair of bit lines BT0, BB0. Similarly, the memory cell MC10 is coupled to the word line WLm and the pair of bit lines BT3, BB3, and the memory cell MC11 is coupled to the word line WLn and the pair of bit lines BT2, BB2.

As described above, one memory cell column is provided with a first memory cell MC01 (MC11) and the memory cell MC00 (MC11). The first memory cell MC00 (MC10) is to be coupled to a first pair of bit lines BT0, BB0 (BT2, BB2). The memory cell MC00 (MC10) is to be coupled to a second pair of bit lines BT1, BB1 (BT3, BB3).

The memory cells (MC00, MC01, MC10, MC11) each have the same configuration as described in conjunction with the first embodiment. That is, the memory cells (MC00, MC01, MC10, MC11) each include the first and second inverter circuits IV0, IV1 and the transfer NMOS transistors Tr0, Tr1. The first and second inverter circuits IV0, IV1 are configured so that their inputs and outputs are cross-coupled to each other to form a flip-flop for storing information.

The source-drain path of the transfer NMOS transistor Tr0 in the memory cells (MC00, MC10) is coupled between the bit line BT1 (BT3), which is one of the pair of bit lines BT1, BB1 (BT3, BB3), and the input of the first inverter circuit IV0 or the output of the second inverter circuit IV1. The gate electrode of the transfer NMOS transistor Tr0 is coupled to the associated word line WLm. The source-drain path of the transfer NMOS transistor Tr1 is coupled between the bit line BB1, which is the other one of the pair of bit lines BT1, BB1 (BT3, BB3), and the output of the first inverter circuit IV0 or the input of the second inverter circuit IV1. The gate electrode of the transfer NMOS transistor Tr1 is coupled to the associated word line WLm.

The source-drain path of the transfer NMOS transistor Tr0 in the memory cells (MC01, MC11) is coupled between the bit line BT0 (BT2), which is one of the pair of bit lines BT0, BB0 (BT2, BB2), and the input of the first inverter circuit IV0 or the output of the second inverter circuit IV1. The gate electrode of the transfer NMOS transistor Tr0 is coupled to the associated word line WLn. The source-drain path of the transfer NMOS transistor Tr1 is coupled between the bit line BB0 (BB2), which is the other one of the pair of bit lines BT0, BB0 (BT2, BB2), and the output of the first inverter circuit IV0 or the input of the second inverter circuit IV1. The gate electrode of the transfer NMOS transistor Tr1 is coupled to the associated word line WLn.

A precharge circuit 2a includes a precharge circuit 21a and a precharge circuit 22a. The precharge circuit 21a precharges the first pair of bit lines BT0, BB0 and the second pair of bit lines BT1, BB1. The precharge circuit 22a precharges a third pair of bit lines BT2, BB2 and a fourth pair of bit lines BT3, BB3. The precharge circuit 21a and the precharge circuit 22a have the same configuration. Therefore, the precharge circuit 21a is described below as a representative, and the description of the precharge circuit 22a is omitted.

The precharge circuit 21a includes PMOS transistors PQ1, PQ2, PQ3. The PMOS transistors PQ1, PQ2 act as a precharge transistor for precharging the pair of bit lines BT0, BB0 to the first reference potential such as the power supply potential VDD. The PMOS transistor PQ3 acts as an equalize transistor for equalizing the potential between the pair of bit lines BT0, BB0. The source-drain path of the PMOS transistor PQ1 is coupled between the bit line BT0 and the wire to which the power supply potential VDD is supplied. The source-drain path of the PMOS transistor PQ2 is coupled between the bit line BB0 and the wire to which the power supply potential VDD is supplied. The source-drain path of the PMOS transistor PQ3 is coupled between the bit line BT0 and the bit line BB0. The gates of the PMOS transistors PQ1, PQ2, PQ3 are coupled in a shared manner so as to receive the column select signal YA0 through the inverter circuits IVS1, IVS2 of a column select circuit 31a as described later.

The precharge circuit 21a further includes PMOS transistors PQ4, PQ5, PQ6. The PMOS transistors PQ4, PQ5 act as a precharge transistor for precharging the pair of bit lines BT1, BB1 to the first reference potential such as the power supply potential VDD. The PMOS transistor PQ6 acts as an equalize transistor for equalizing the potential between the pair of bit lines BT1, BB1. The source-drain path of the PMOS transistor PQ4 is coupled between the bit line BT1 and the wire to which the power supply potential VDD is supplied. The source-drain path of the PMOS transistor PQ5 is coupled between the bit line BB1 and the wire to which the power supply potential VDD is supplied. The source-drain path of the PMOS transistor PQ6 is coupled between the bit line BT1 and the bit line BB1. The gates of the PMOS transistors PQ4, PQ5, PQ6 are coupled in a shared manner so as to receive the later-described column select signal YA0 through the inverter circuits IVS1, IVS2.

It should be noted that the precharge circuit 22a receives a Y address signal YA1 through the inverter circuits IVS1, IVS2 of a column select circuit 32a.

A column select circuit 3a includes the column select circuit 31a and the column select circuit 32a. The column select circuit 31a couples the first pair of bit lines BT0, BB0 and the second pair of bit lines BT1, BB1 to the write circuit 4 in accordance with the selection level of YA0 of the column select signals (column address signal and Y address signal) YA[1:0] and with the signal level of a row select signal (row address signal and X address signal) XA. The column select circuit 32a couples the third pair of bit lines BT2, BB2 and the fourth pair of bit lines BT3, BB3 to the write circuit 4 in accordance with the selection level of YA1 of the column select signals YA[1:0] and with the signal level of the row select signal XA.

The column select circuit 31a includes the inverter circuits IVS1, IVS2, the NMOS transistors NS1, NS2, NS3, NS4, NMOS transistors NS11, NS21, NS31, NS41, NAND circuits NAS1, NAS2, and inverter circuits IVS3, IVS4, IVS5. The NMOS transistors NS1, NS2, NS3, NS4 act as a first select transistor. The NMOS transistors NS11, NS21, NS31, NS41 act as a second select transistor.

One input of the NAND circuit NAS1 receives the row select signal XA through the inverter circuit IVS3. The other input of the NAND circuit NAS1 receives YA0 of the column select signals YA[1:0]. The output of the NAND circuit NAS1 is coupled to the common gate of the NMOS transistors NS1, NS2, NS3, NS4 through the inverter circuit IVS4. One input of the NAND circuit NAS2 receives the row select signal XA. The other input of the NAND circuit NAS2 receives YA0 of the column select signals YA[1:0]. The output of the NAND circuit NAS2 is coupled to the common gate of the NMOS transistors NS11, NS21, NS31, NS41 through the inverter circuit IVS5.

The source-drain paths of the NMOS transistors NS1, NS2 are coupled between the first pair of bit lines BT0, BB0 and the pair of common bit lines CBT, CBB. The source-drain paths of the NMOS transistors NS3, NS4 are coupled between the second pair of bit lines BT1, BB1 and the pair of common auxiliary lines CNBT, CNBB. The source-drain paths of the NMOS transistors NS11, NS21 are coupled between the second pair of bit lines BT1, BB1 and the pair of common bit lines CBT, CBB. The source-drain paths of the NMOS transistors NS31, NS41 are coupled between the first pair of bit lines BT0, BB0 and the pair of common auxiliary lines CNBT, CNBB.

The column select circuit 32a is similar in circuit configuration to the column select circuit 31a. However, the column select circuit 32a differs from the column select circuit 31a in that the input of the inverter circuit IVS1, the other input of the NAND circuit NAS1, and the other input of the NAND circuit NAS2 receive YA1 of the column select signals YA[1:0]. In the column select circuit 32a, the source-drain paths of the NMOS transistors NS1, NS2 are coupled between the third pair of bit lines BT2, BB2 and the pair of common bit lines CBT, CBB. The source-drain paths of the NMOS transistors NS3, NS4 are coupled between the fourth pair of bit lines BT3, BB3 and the pair of common auxiliary lines CNBT, CNBB. Further, in the column select circuit 32a, the source-drain paths of the NMOS transistors NS11, NS21 are coupled between the fourth pair of bit lines BT3, BB3 and the pair of common bit lines CBT, CBB. The source-drain paths of the NMOS transistors NS31, NS41 are coupled between the third pair of bit lines BT2, BB2 and the pair of common auxiliary lines CNBT, CNBB.

The configurations of the write circuit 4 and readout circuit 5 are the same as described in conjunction with the first embodiment and will not be redundantly described.

When the row select signal XA is at the low level in the semiconductor memory device 1a according to the second embodiment, the word line WLn is activated to select the memory cell MC01 (MC10). Meanwhile, when the row select signal XA is at the high level, the word line WLm is activated to select the memory cell MC00 (MC11). Further, when the row select signal XA is at the low level and the column select signal YA0 is at the high level, the column select circuit 31a couples the bit line pair BT0/BB0 to the common bit line pair CBT/CBB, and couples the bit line pair BT1/BB1 to the common auxiliary line pair CNBT/CNBB. When the row select signal XA is at the high level and the Y address signal YA0 is at the high level, the column select circuit 31a conversely couples the bit line pair BT1/BB1 to the common bit line pair CBT/CBB and couples the bit line pair BT0/BB0 to the common auxiliary line pair CNBT/CNBB.

As described above, when the memory cell MC01 is selected, BT0/BB0 functions as a bit line pair, and BT1/BB1 functions as a negative-bias generation capacitance wiring pair. When, by contrast, the memory cell MC00 is selected, BT1/BB1 functions as a bit line pair, and BT0/BB0 functions as an auxiliary line pair that acts as a negative-bias generation capacitance wiring pair.

When the row select signal XA is at the low level and the column select signal YA1 is at the high level, the column select circuit 32a couples the bit line pair BT2/BB2 to the common bit line pair CBT/CBB, and couples the bit line pair BT3/BB3 to the common auxiliary line pair CNBT/CNBB. When the row select signal XA is at the high level and the column select signal YA1 is at the high level, the column select circuit 32a conversely couples the bit line pair BT3/BB3 to the common bit line pair CBT/CBB and couples the bit line pair BT2/BB2 to the common auxiliary line pair CNBT/CNBB.

As described above, when the memory cell MC11 is selected, BT2/BB2 functions as a bit line pair, and BT3/BB3 functions as an auxiliary line pair that acts as a negative-bias generation capacitance wiring pair. When, by contrast, the memory cell MC10 is selected, BT3/BB3 functions as a bit line pair, and BT2/BB2 functions as an auxiliary line pair that acts as a negative-bias generation capacitance wiring pair.

Figure 4:
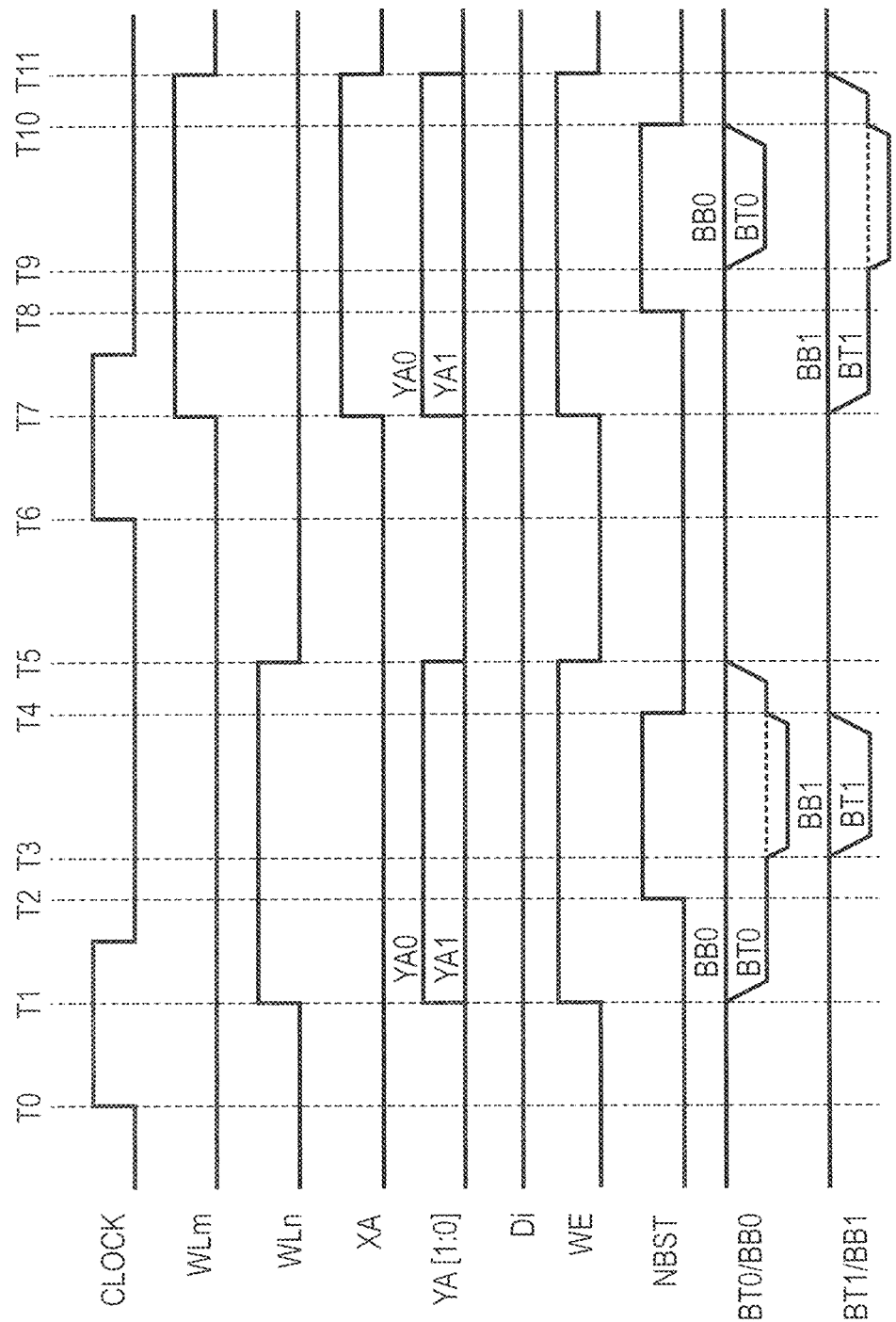
FIG. 4 is a timing diagram illustrating the operations of the semiconductor memory device according to the second embodiment.

FIG. 4 is a timing diagram illustrating the operations of the semiconductor memory device according to the second embodiment. Main operations are the same as depicted by the timing diagram of FIG. 2, which illustrates the operations in the first embodiment. During a period from time T0 to time T5, that is, while the row select signal XA is at the low level, BT0/BB0 functions as a bit line pair, and BT1/BB1 functions as an auxiliary line pair (NBT0, NBB0) that acts as a negative-bias generation capacitance wiring pair. Meanwhile, during a period from time T6 to time T11, that is, while the row select signal XA is at the high level, BT1/BB1 functions as a bit line pair, and BT0/BB0 functions as an auxiliary line pair (NBT0, NBB0) that acts as a negative-bias generation capacitance wiring pair.

First of all, the clock signal CLOCK rises at time T0. It is assumed that the rise of the clock signal CLOCK is used as a trigger for placing the row select signal XA at the low level and activating the word line WLn to the high level at time T1. It is also assumed that YA0 of the column select signals YA[1:0] is simultaneously activated to the high level.

Further, the write enable signal WE is activated to the high level so that the bit line pair BT0/BB0 is selected and driven.

It is assumed that the input data Di at the data input terminal DI is at the low level. In this instance, the write driver circuit WRD drives the bit line BT0 to the low level. That is, the PMOS transistor PT1 in the write driver circuit WRD turns off and the NMOS transistors NT1 and NT3 turn on. Therefore, the bit line BT0 is transitioned or driven from the precharge level (high level) to the low level such as the ground potential VSS. Meanwhile, the PMOS transistor PT2 in the write driver circuit WRD turns on and the NMOS transistors NT2 and NT4 turn off. Therefore, the bit line BB0 remains at the precharge level (high level).

After the lapse of a predetermined period of time, that is, at time T2, the negative-bias assist signal NBST is activated to the high level. This immediately turns off the NMOS transistor NT3 in the write driver circuit WRD, which drives a bit line pair to the low level. Therefore, the source node of the NMOS transistor NT1 is uncoupled from the ground potential VSS. As a result, the bit line BT0, which is driven to the low level, is placed in the high-impedance (high-Z) state or the floating state.

After a fixed delay is introduced by the delay circuit DL1 in the write assist circuit NBC0, the auxiliary line (bit line BT1), which is a negative-bias generation capacitance wiring, is driven at time T3 from the high level to the low level. The auxiliary line (bit line BB1) remains at the high level. As the input data Di is currently at the low level, the auxiliary line (BT1) is driven to the low level. The parasitic capacitance C0 between BT0 and BT1 further decreases the voltage of the bit line BT0 in the high-Z state from the low level, such as the ground potential VSS, toward a negative bias (−V). This causes data to be written into the memory cell MC01. At time T4, the negative-bias assist signal NBST is deactivated to the low level so that the bit line BT0 is transitioned to the low level such as the ground potential VSS. Further, the auxiliary line (bit line BT1) is precharged to the precharge level such as the high level. Furthermore, at time T5, the write enable signal WE is deactivated to the low level, and the bit line pair BT0/BB0 is precharged by the precharge circuit 21 to the precharge level such as the high level. Moreover, the row select signal XA, the word line WLn, and the column select signal YA0 are also deactivated and transitioned to the initial state such as the low level.

At time T6, the clock signal CLOCK rises. It is assumed that the rise of the clock signal CLOCK is used as a trigger for placing the row select signal XA at the high level and activating the word line WLm to the high level at time T7. It is also assumed that YA0 of the column select signals YA[1:0] is simultaneously activated to the high level. Further, the write enable signal WE is activated to the high level so that the bit line pair BT1/BB1 is selected and driven.

It is assumed that the input data Di at the data input terminal DI is at the low level. In this instance, the write driver circuit WRD drives the bit line BT1 to the low level. That is, the PMOS transistor PT1 in the write driver circuit WRD turns off and the NMOS transistors NT1 and NT3 turn on. Therefore, the bit line BT1 is transitioned or driven from the precharge level (high level) to the low level such as the ground potential VSS. Meanwhile, the PMOS transistor PT2 in the write driver circuit WRD turns on and the NMOS transistors NT2 and NT4 turn off. Therefore, the bit line BB1 remains at the precharge level (high level).

After the lapse of a predetermined period of time, that is, at time T8, the negative-bias assist signal NBST is activated to the high level. This immediately turns off the NMOS transistor NT3 in the write driver circuit WRD, which drives a bit line pair to the low level. Therefore, the source node of the NMOS transistor NT1 is uncoupled from the ground potential VSS. As a result, the bit line BT01, which is driven to the low level, is placed in the high-impedance (high-Z) state or the floating state.

After a fixed delay is introduced by the delay circuit DL1 in the write assist circuit NBC0, the auxiliary line (bit line BT0), which is a negative-bias generation capacitance wiring, is driven at time T9 from the high level to the low level. The auxiliary line (bit line BB0) remains at the high level. As the input data Di is currently at the low level, the auxiliary line (BT1) is driven to the low level. The parasitic capacitance C0 between BT0 and BT1 further decreases the voltage of the bit line BT1 in the high-Z state from the low level, such as the ground potential VSS, toward a negative potential or a negative bias (−V). This causes data to be written into the memory cell MC01. At time T10, the negative-bias assist signal NBST is deactivated to the low level so that the bit line BT1 is transitioned to the low level such as the ground potential VSS. Further, the auxiliary line (bit line BT0) is precharged to the precharge level such as the high level. Furthermore, at time T10, the write enable signal WE is deactivated to the low level, and the bit line pair BT1/BB1 is precharged by the precharge circuit 21 to the precharge level such as the high level. Moreover, the row select signal XA, the word line WLm, and the column select signal YA0 are also deactivated and transitioned to the initial state such as the low level.

When the input data Di is at the high level, the column select signal YA0 is at the high level, and the row select signal XA is at the low level, the bit line BB0 is driven to the low level due to the high level of the input data Di, and the bit line BB1 is handled as an auxiliary line and driven to the low level. When the input data Di is at the high level, the column select signal YA0 is at the high level, and the row select signal XA is at the high level, the bit line BB1 is driven to the low level due to the high level of the input data Di, and the bit line BB0 is handled as an auxiliary line and driven to the low level.

The second embodiment provides the following advantageous effects in addition to the advantageous effects provided by the first embodiment.

1) The first bit line pair and the second bit line pair are provided by dividing the bit lines in each of the memory cell columns. The first bit line pair and the second bit line pair are used as a bit line pair or a negative-bias generation capacitance wiring pair (auxiliary line pair). This reduces the overall area of the semiconductor memory device.

2) Referring to the advantageous effect described in 1) above, the number of memory cells coupled to the first bit line pair or the second bit line pair is reduced, for example, to ½ as compared to the semiconductor memory device according to the first embodiment. This reduces the parasitic capacitance due to memory cell coupling to the first bit line pair or the second bit line pair. Therefore, the speed of potential variation of a bit line pair or a negative-bias generation capacitance wiring pair (auxiliary line pair) can be increased. This makes it possible to increase the write and read speeds.

(Exemplary Layout Configuration 1)

Figure 5:
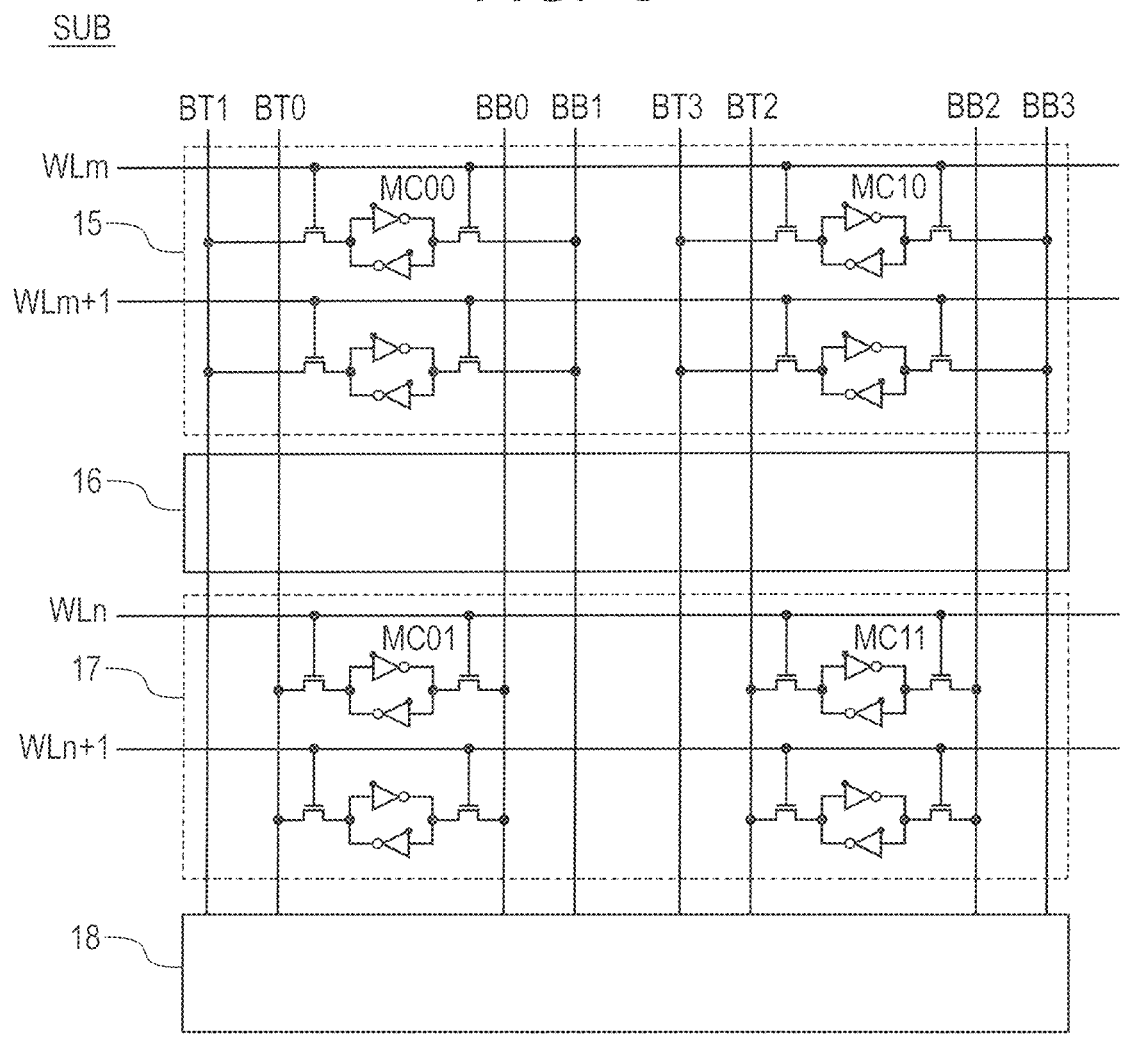
FIG. 5 is a diagram illustrating an exemplary layout configuration of the semiconductor memory device according to the second embodiment.
Figure 6:
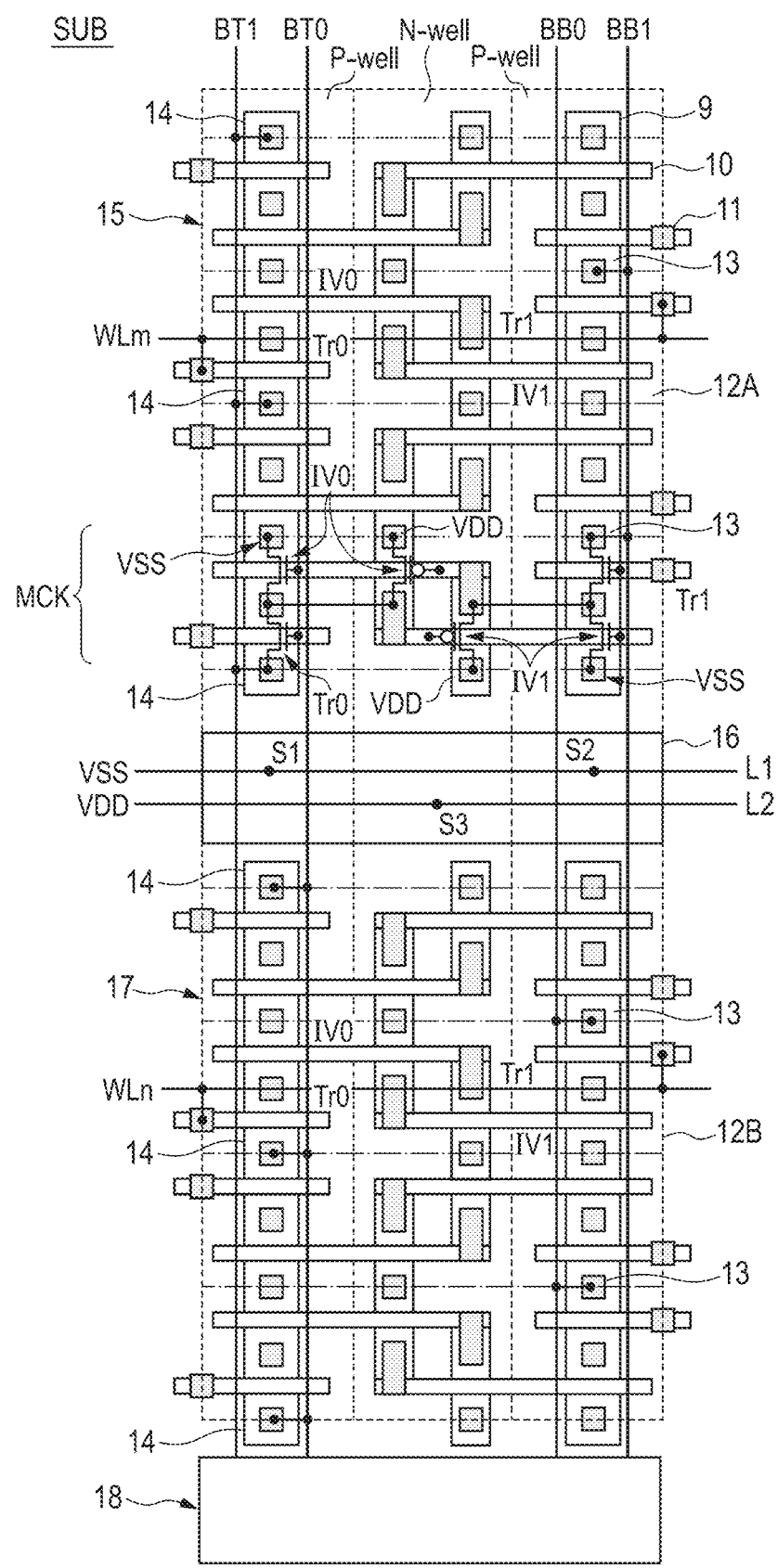
FIG. 6 is a diagram illustrating an exemplary layout of the semiconductor memory device depicted in FIG. 5.

FIG. 5 is a diagram illustrating an exemplary layout configuration of the semiconductor memory device according to the second embodiment. FIG. 5 illustrates an exemplary layout configuration of a semiconductor substrate SUB of the semiconductor memory device. In FIG. 5, the reference numeral 15 denotes a first memory array, and the reference numeral 17 denotes a second memory array. The first memory array 15 includes multiple memory cells (MC00, MC10) coupled to the pair of bit lines BT1, BB1 or BT3, BB3. The second memory array 17 includes multiple memory cells (MC01, MC11) coupled to the pair of bit lines BT0, BB0 or BT2, BB2. A well tap region 16 illustrated with reference to FIG. 6 is disposed between the first memory array 15 and the second memory array 17. The reference numeral 18 denotes an input/output region where the write circuit 4 and readout circuit 5 depicted in FIG. 3 are disposed.

FIG. 6 is a diagram illustrating an exemplary layout of the semiconductor memory device depicted in FIG. 5. FIG. 6 illustrates an exemplary layout configuration of one memory cell column on the semiconductor substrate SUB that includes the pairs of bit lines BT1, BB1, BT0, BB0 of the semiconductor memory device depicted in FIG. 5.

The first memory array 15 depicted in FIG. 6 exemplifies a conceptual memory cell layout configuration where four memory cells coupled to the pair of bit lines BT1, BB1 are arranged vertically. Meanwhile, the second memory array 17 depicted in FIG. 6 exemplifies a conceptual memory cell layout configuration where four memory cells coupled to the pair of bit lines BT0, BB0 are arranged vertically. The well tap region 16 is disposed between the first memory array 15 and the second memory array 17. In the present example, the second memory array 17 is disposed between the well tap region 16 and the input/output region 18. That is, the first memory array 15, the well tap region 16, the second memory array 17, and the input/output region 18 are disposed, in the order named, on the surface of the semiconductor substrate SUB.

In the first memory array 15 and the second memory array 17, the reference numeral 9 denotes an N-type or P-type impurity introduction layer, the reference numeral 10 denotes a gate, and the reference numeral 11 denotes a contact portion. The reference numeral 12A exemplifies one memory cell coupled to the word line WLm and the pair of bit lines BT1, BB1, such as the memory cell MC00 depicted in FIGS. 3 and 5. The reference numeral 12B exemplifies one memory cell coupled to the word line WLn and the pair of bit lines BT0, BB0, such as the memory cell MC11 depicted in FIGS. 3 and 5.

In the memory cell 12A, the transfer NMOS transistors Tr0, Tr1 each include the N-type impurity introduction layer 9 and the gate 10, which are formed in a P-type well region P-well. The inverter circuits IV0, IV1 of the memory cell 12A each include an NMOS transistor and a PMOS transistor. The NMOS transistor includes the N-type impurity introduction layer 9 and the gate 10, which are formed in the P-type well region P-well. The PMOS transistor includes the P-type impurity introduction layer 9 and the gate 10, which are formed in the N-type well region N-well. That is, the memory cell 12A is a single-port memory cell having six transistors. In the first memory array 15, the reference numeral 13 denotes an impurity introduction layer of a coupling section (node) to which the paired bit line BB1 is coupled, and the reference numeral 14 denotes an impurity introduction layer of a coupling section (node) to which the paired bit line BT1 is coupled. The reference numerals 13 and 14 denote an impurity introduction layer in which the source and the drain are shared in the upper and lower memory cells. The word line WLm is coupled to the gates of the transfer NMOS transistors Tr0, Tr1 through the contact portion 11. Although word lines are also coupled to the other memories in the first memory array 15, such word lines are not depicted in FIG. 6 in order to avoid a complicated drawing. As regards an MCK portion of the first memory array 15, more detailed coupling relations between transistors included in a memory cell are depicted.

In the memory cell 12B, the transfer NMOS transistors Tr0, Tr1 each include the N-type impurity introduction layer 9 and the gate 10, which are formed in the P-type well region P-well. The inverter circuits IV0, IV1 of the memory cell 12B each include an NMOS transistor and a PMOS transistor. The NMOS transistor includes the N-type impurity introduction layer 9 and the gate 10, which are formed in the P-type well region P-well. The PMOS transistor includes the P-type impurity introduction layer 9 and the gate 10, which are formed in the N-type well region N-well. That is, the memory cell 12B is a single-port memory cell having six transistors. In the second memory array 17, the reference numeral 13 denotes an impurity introduction layer of a coupling section (node) to which the paired bit line BB0 is coupled, and the reference numeral 14 denotes an impurity introduction layer of a coupling section (node) to which the paired bit line BT0 is coupled. The reference numerals 13 and 14 denote an impurity introduction layer in which a source/drain is shared in the upper and lower memory cells. The word line WLn is coupled to the gates of the transfer NMOS transistors Tr0, Tr1 through the contact portion 11. Although word lines are also coupled to the other memories in the second memory array 17, such word lines are not depicted in FIG. 6 in order to avoid a complicated drawing.

The well tap region (power feed region) 16 is provided to feed the second reference potential, such as the ground potential VSS, to two P-type well regions P-well where the NMOS transistors of the memory cells 12A, 12B are formed, and feed the first reference potential, such as the power supply potential VDD, to the N-type well region N-well where the PMOS transistors of the memory cells 12A, 12B are formed. The well tap region 16 is provided with a power supply wiring L1 to which the ground potential VSS is supplied, and a power supply wiring L2 to which the power supply potential VDD is supplied. The power supply wiring L1 is coupled to the two P-type well regions P-well through supply sections S1, S2. The power supply wiring L2 is coupled to the N-type well region N-well through a supply section S3. As depicted, the N-type well region N-well is disposed between the two P-type well regions P-well.

As described above, a source/drain (13, 14), which is coupled to bit line pairs for the memory cells 12A, 12B with the well tap region 16 positioned in between, is not shared. Therefore, the first memory array 15 and the second memory array 17 can be disposed to separate the pair of bit lines BT0, BB0 and the pair of bit lines BT1, BB1.

(Exemplary Layout Configuration 2)

Figure 7:
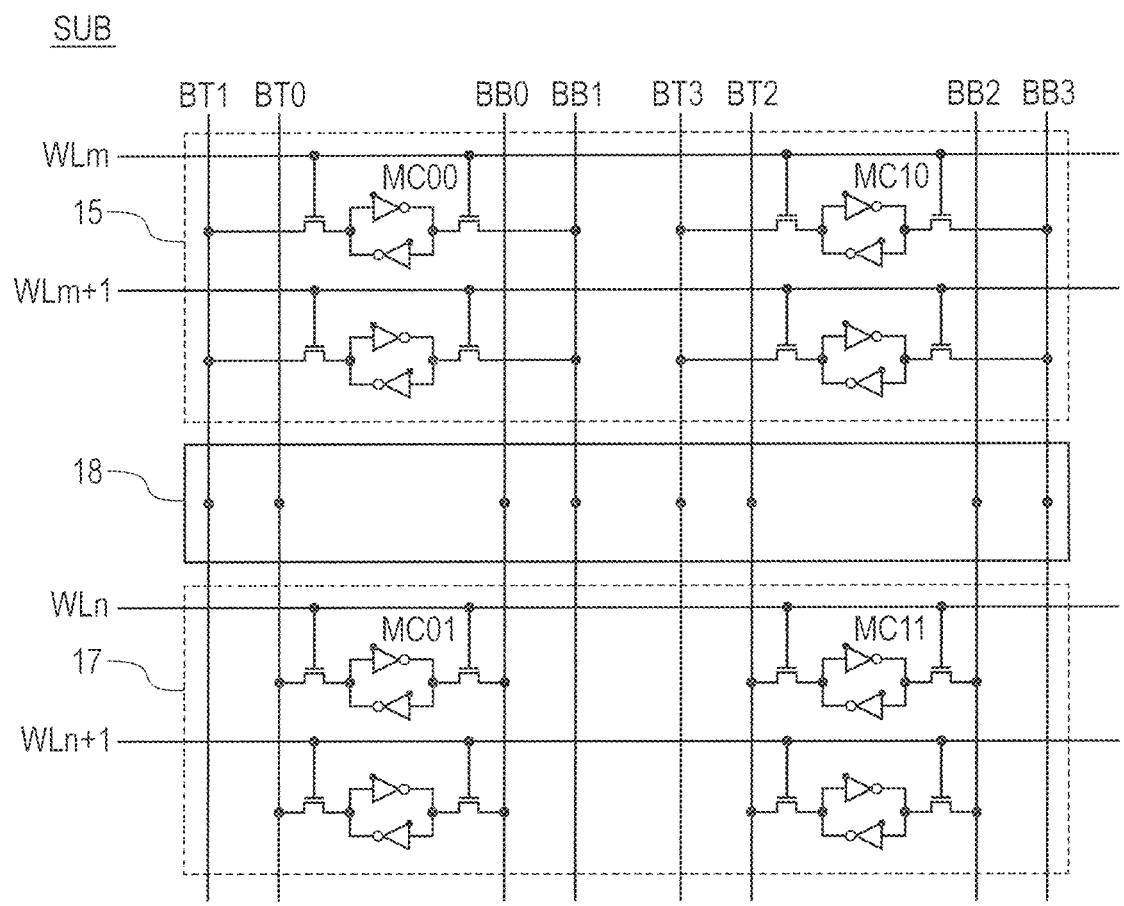
FIG. 7 is a diagram illustrating another exemplary layout configuration of the semiconductor memory device according to the second embodiment.

FIG. 7 is a diagram illustrating another exemplary layout configuration of the semiconductor memory device according to the second embodiment. FIGS. 5 and 6 indicate that the well tap region 16 is disposed between the first memory array 15 and the second memory array 17. Meanwhile, FIG. 7 indicates that the input/output region 18 is disposed, in place of the well tap region 16, between the first and second memory arrays 15, 17 on the semiconductor substrate SUB. The input/output region 18 includes the write circuit 4 and readout circuit 5 depicted in FIG. 3, as is the case with FIG. 6.

In this case, the N-type well region N-well and the two P-type well regions P-well are eliminated from a portion in which the input/output region 18 is disposed. That is, the input/output region 18 is disposed between the first memory array 15 and the second memory array 17. Therefore, the N-type well region N-well and two P-type well regions P-well of the first memory array 15 are separated from the N-type well region N-well and two P-type well regions P-well of the second memory array 17.

Even when the layout configuration illustrated in FIG. 7 is adopted, a source/drain (13, 14), which is coupled to bit line pairs for the memory cells 12A, 12B with the input/output region 18 positioned in between, is not shared, as is the case with FIG. 6. Therefore, the first memory array 15 and the second memory array 17 can be disposed to separate the pair of bit lines BT0, BB0 and the pair of bit lines BT1, BB1.

Third Embodiment

Figure 8:
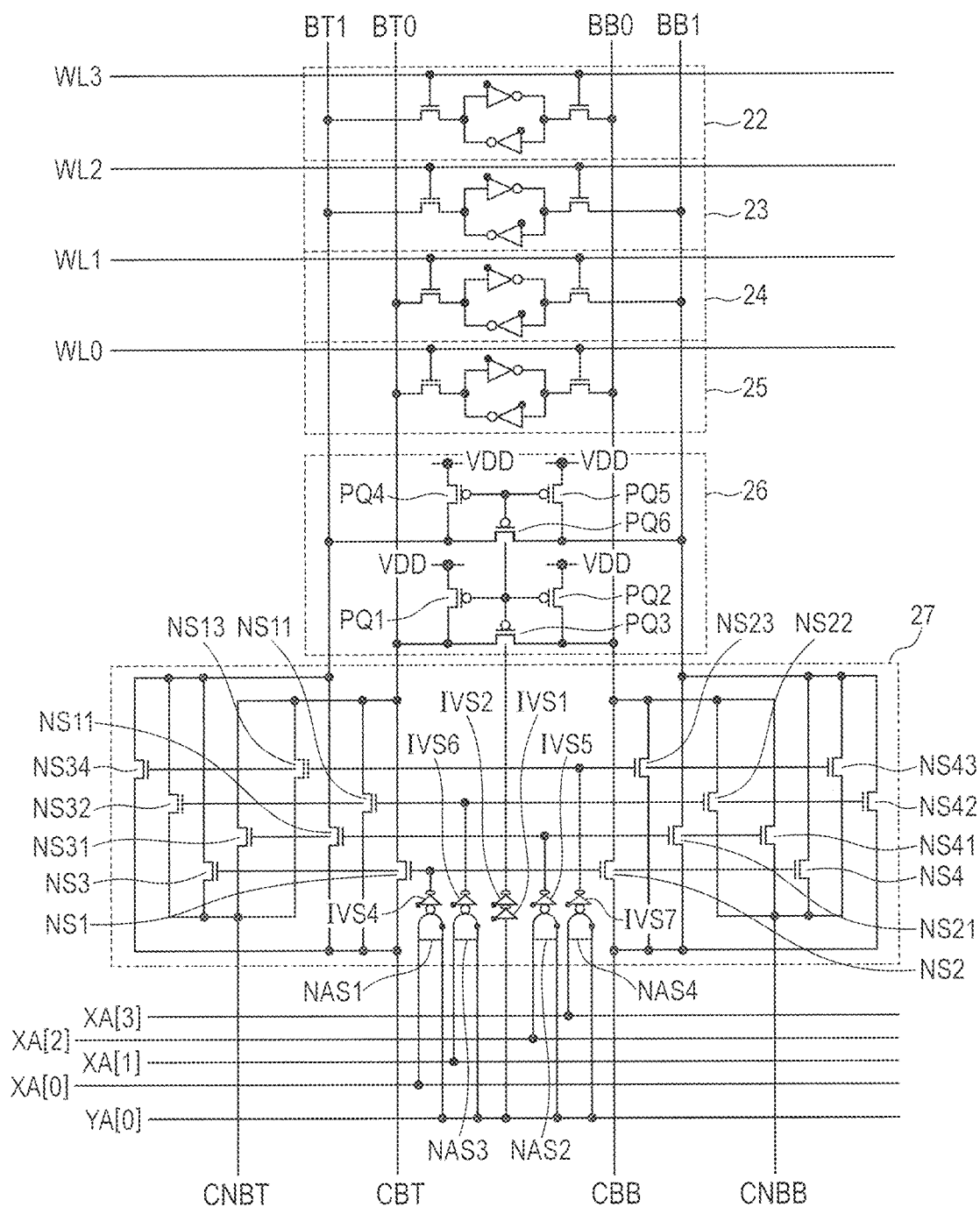
FIG. 8 is a diagram illustrating the semiconductor memory device according to a third embodiment of the present invention.

FIG. 8 is a diagram illustrating the semiconductor memory device according to a third embodiment of the present invention. The semiconductor memory device 1*b* illustrated in FIG. 8, which is a SRAM, is configured so that four single-port memory cells are used as one layout unit, and that switching can be made between a bit line pair and a negative-bias generation capacitance wiring pair on an individual memory cell basis.

A memory cell 22 is coupled to a word line WL3 and a pair of bit lines BT1, BB0. A memory cell 23 is coupled to a word line WL2 and the pair of bit lines BT1, BB1. A memory cell 24 is coupled to a word line WL1 and a pair of bit lines BT0, BB1. A memory cell 25 is coupled to a word line WL) and the pair of bit lines BT0, BB0. The memory cells 22, 23, 24, 25 have the same configuration as the memory cells MC00, MC01 depicted in FIGS. 1 and 3.

The memory cell 22 and the memory cell 23 share the bit line BT1. The memory cell 23 and the memory cell 24 share the bit line BB1. The memory cell 24 and the memory cell 25 share the bit line BT0. The memory cell 22 and the memory cell 25 share the bit line BB0. That is, the upper and lower memory cells alternately share the bit lines BT1, BT0, BB1, BB0. In the resulting layout, therefore, the memory cells are similarly coupled in a cycle of four cells. Accordingly, one memory cell column is configured with four cells handled as one layout unit. That is, although FIG. 8 depicts only the first memory column to be selected by the column select signal YA0, the semiconductor memory device having the first and second memory columns can be configured as depicted in FIGS. 1 and 3 by providing the second memory column to be selected by the column select signal YA1.

When the word lines (WL0-WL3) are formed by the first metal wiring layer, the pairs of bit lines (BT0, BB0, BT1, BB1) are formed by the second metal wiring layer in a direction crossing the word lines (WL0-WL3). When the pairs of bit lines (BT0, BB0, BT1, BB1) are formed by the first metal wiring layer, the word lines (WL0-WL3) are formed by the second metal wiring layer in a direction crossing the pairs of bit lines (BT0, BB0, BT1, BB1).

In the third embodiment, too, the bit lines BT0 and BT1 run parallel to each other, and the bit lines BB0 and BB1 run parallel to each other, as is the case with the second embodiment. Similarly, the bit lines BT2 and BT3 run parallel to each other, and the bit lines BB2 and BB3 run parallel to each other. Although not depicted in FIG. 8, the parasitic capacitance C0 exists between the bit line BT0 and the bit line BT1, and the parasitic capacitance C1 exists between the bit line BB0 and the bit line BB1.

The reference numeral 26 denotes a precharge circuit that precharges the pairs of bit lines BT1, BB1, BT0, BB0. The precharge circuit 26 has the same configuration as the precharge circuit 2*a* (21*a*, 22*a*) depicted in FIG. 3. Therefore, the configuration of the precharge circuit 26 will not be redundantly described.

The reference numeral 27 denotes a column selector circuit. The column selector circuit 27 selectively couples the pairs of bit lines BT1, BB1, BT0, BB0 to the pair of common bit lines CBT, CBB and the pair of common auxiliary lines CNBT, CNBB. The pair of common bit lines CBT, CBB and the pair of common auxiliary lines CNBT, CNBB are coupled to the write circuit 4 (the write driver circuit WRD and the write assist circuits NBC0, NBC1) depicted in FIG. 1 or 3. However, FIG. 8 does not depict the write circuit 4 (the write driver circuit WRD and the first and second write assist circuits NBC0, NBC1).

The column selector circuit 27 includes the select transistors NS1, NS2 and the select transistors NS3, NS4. The select transistors NS1, NS2 couple the pair of bit lines BT0, BB0 to the pair of common bit lines CBT, CBB. The select transistors NS3, NS4 couple the pair of bit lines BT1, BB1 to the pair of common auxiliary lines CNBT, CNBB. The common gate of the select transistors NS1, NS2, NS3, NS4 is coupled to the output of the inverter circuit IVS4 that is coupled to the output of the NAND circuit NAS1, which receives the column select signal YA[0] and the row select signal XA[0].

The column selector circuit 27 also includes the select transistors NS11, NS21 and the select transistors NS31, NS41. The select transistors NS11, NS21 couple the pair of bit lines BT1, BB1 to the pair of common bit lines CBT, CBB. The select transistors NS31, NS41 couple the pair of bit lines BT0, BB0 to the pair of common auxiliary lines CNBT, CNBB. The common gate of the select transistors NS11, NS21, NS31, NS41 is coupled to the output of the inverter circuit IVS5 that is coupled to the output of the NAND circuit NAS2, which receives the column select signal YA[0] and the row select signal XA[2].

The column selector circuit 27 further includes the select transistors NS12, NS42 and the select transistors NS32, NS22. The select transistors NS12, NS42 couple the pair of bit lines BT0, BB1 to the pair of common bit lines CBT, CBB. The select transistors NS32, NS22 couple the pair of bit lines BT1, BB0 to the pair of common auxiliary lines CNBT, CNBB. The common gate of the select transistors NS12, NS22, NS32, NS42 is coupled to the output of an inverter circuit IVS6 that is coupled to the output of a NAND circuit NAS3, which receives the column select signal YA[0] and the row select signal XA[1].

The column selector circuit 27 additionally includes the select transistors NS33, NS23 and the select transistors NS13, NS43. The select transistors NS33, NS23 couple the pair of bit lines BT1, BB0 to the pair of common bit lines CBT, CBB. The select transistors NS13, NS43 couple the pair of bit lines BT0, BB1 to the pair of common auxiliary lines CNBT, CNBB. The common gate of the select transistors NS13, NS23, NS33, NS43 is coupled to the output of an inverter circuit IVS7 that is coupled to the output of a NAND circuit NAS4, which receives the column select signal YA[0] and the row select signal XA[3].

Consequently, when the row select signal XA[3] is activated to select the memory cell 22, the column selector circuit 27 couples BT1/BB0 to the common bit line pair CBT/CBB and couples BT0/BB1 to the common auxiliary line pair CNBT/CNBB. Similarly, for the memory cell 23, the column selector circuit 27 couples BT1/BB1 to the common bit line pair CBT/CBB and couples BT0/BB0 to the common auxiliary line pair CNBT/CNBB. For the memory cells 24, 25, the column selector circuit 27 couples the bit line pair BT0/BB1, which is coupled to the memory cell 24, to the common bit line pair CBT/CBB, and couples the uncoupled bit line pair BT1/BB0 to the common line pair CNBT/CNBB.

Figure 9:
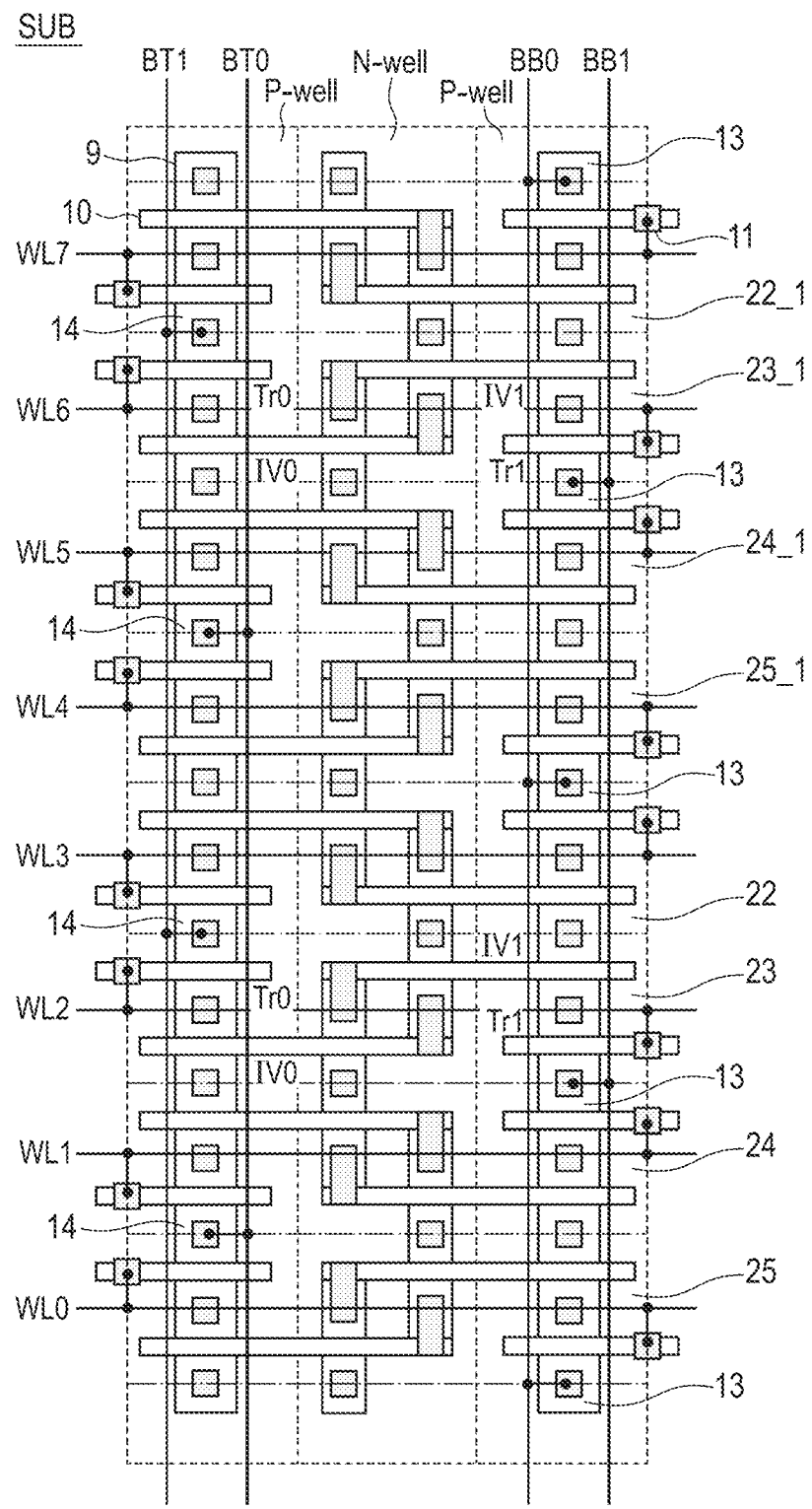
FIG. 9 is a diagram illustrating the layout of one memory cell column of the semiconductor memory device according to the third embodiment.

FIG. 9 is a diagram illustrating the layout of one memory cell column of the semiconductor memory device according to the third embodiment. As illustrated in FIG. 9, one memory cell column of the semiconductor memory device 1b is configured so that the memory cells 22-25 are handled as one layout unit to illustrate an exemplary configuration in which two layout units are exemplarily disposed. A first layout unit includes four memory cells 22, 23, 24, 25. A second layout unit includes four memory cells 22_1, 23_1, 24_1, 25_1.

In FIG. 9, the reference numeral 9 denotes an N-type or P-type impurity introduction layer, the reference numeral 10 denotes a gate, and the reference numeral 11 denotes a contact portion, as is the case with FIG. 9. The reference numeral 13 denotes an impurity introduction layer of a coupling section (node) to which the bit line BB0 or BB1 is coupled. The reference numeral 14 denotes an impurity introduction layer of a coupling section (node) to which the bit line BT0 or BT1 is coupled. The reference numerals 13 and 14 denote an impurity introduction layer in which a source/drain is shared by the upper and lower memory cells.

As explained with reference to FIG. 8, the memory cells 22, 23, 24, 25 are configured as described below. The memory cell 22 is coupled to the word line WL3 and the pair of bit lines BT1, BB0. The memory cell 23 is coupled to the word line WL2 and the pair of bit lines BT1, BB1. The memory cell 24 is coupled to the word line WL1 and the pair of bit lines BT0, BB1. The memory cell 25 is coupled to the word line WL0 and the pair of bit lines BT0, BB0.

The memory cells 22_1, 23_1, 24_1, 25_1 are configured as described below. The memory cell 22_1 is coupled to the word line WL7 and the pair of bit lines BT1, BB0. The memory cell 23_1 is coupled to the word line WL6 and the pair of bit lines BT1, BB1. The memory cell 24_1 is coupled to the word line WL5 and the pair of bit lines BT0, BB1. The memory cell 25_1 is coupled to the word line WL4 and the pair of bit lines BT0, BB0.

Referring to FIG. 9, when the word lines (WL0-WL7) are formed by a first metal wiring layer, the bit line pairs (BT0, BB0, BT1, BB1) are formed by a second metal wiring layer in a direction crossing the word lines (WL0-WL7). When the bit line pairs (BT0, BB0, BT1, BB1) are formed by the first metal wiring layer, the word lines (WL0-WL7) are formed by the second metal wiring layer in a direction crossing the bit line pairs (BT0, BB0, BT1, BB1).

As depicted in FIGS. 8 and 9, the third embodiment uses the row select signals XA[0]-XA[3] to select one memory cell from four memory cells even within a single memory mat in which a source/drain is shared. The bit line pair coupling is then switched in accordance with the memory cell to be selected so that a bit line pair not coupled to the memory cell to be selected can be used as a negative-bias generation capacitance wiring pair (auxiliary line pair).

Fourth Embodiment

Figure 10:
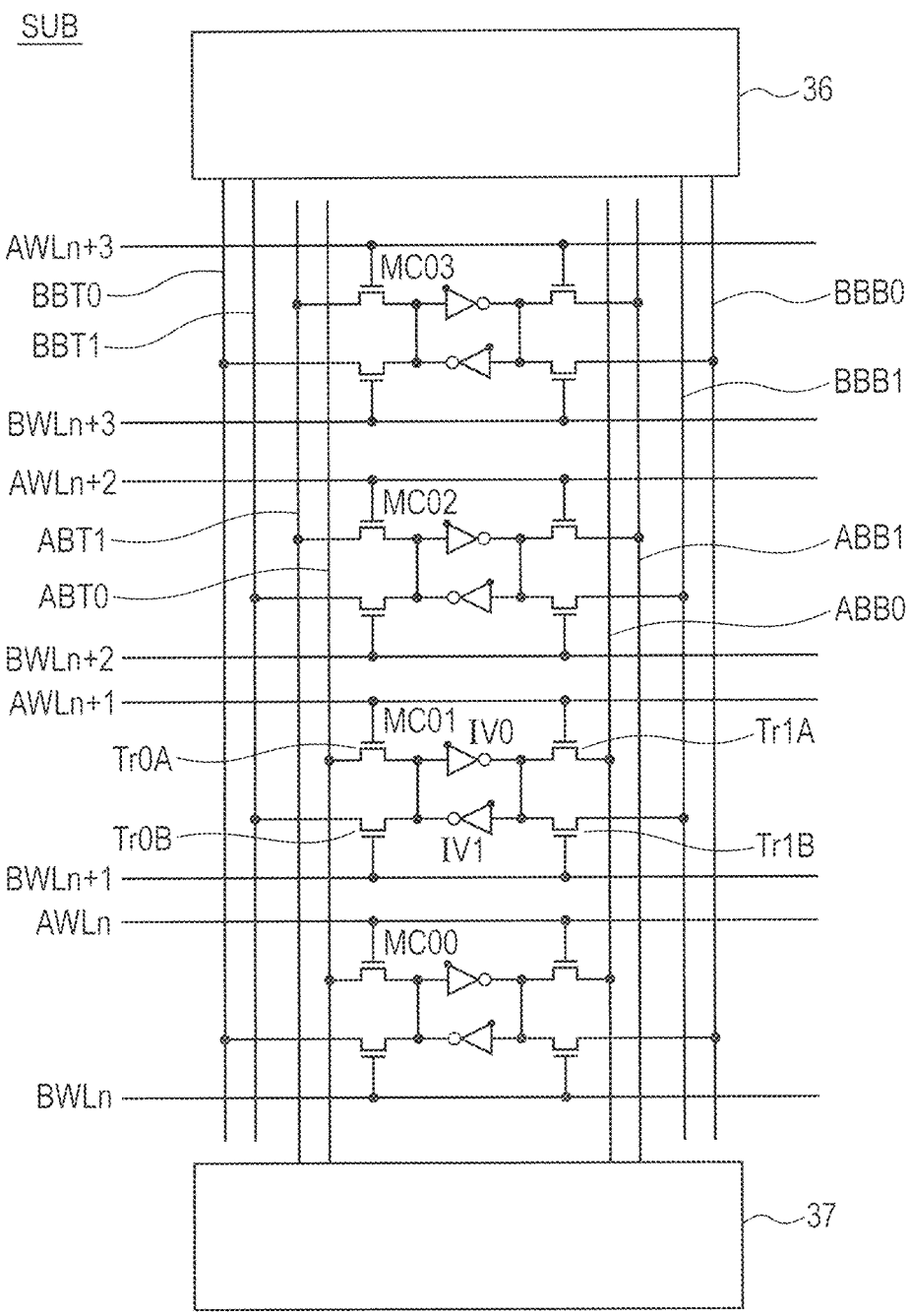
FIG. 10 is a diagram illustrating the semiconductor memory device according to a fourth embodiment of the present invention.

FIG. 10 is a diagram illustrating the semiconductor memory device according to a fourth embodiment of the present invention. The semiconductor memory device 1c according to the fourth embodiment, which is a SRAM, includes dual-port memory cells (MC00, MC01, MC02, MC03) as memory cells. Each of the dual-port memory cells (M000, MC01, MC02, MC03) is an 8 T SRAM memory cell (8 T DP-SRAM cell) having eight transistors.

The dual-port memory cells (MC00, MC01, MC02, MC03) each include an A port and a B port. The A port acts as a first input/output section or a first port. The B port acts as a second input/output section or a second port. As exemplified by the memory cell MC01 in FIG. 10, the dual-port memory cells (MC00, MC01, MC02, MC03) each include A-port transfer NMOS transistors Tr0A, Tr1A, B-port transfer NMOS transistors Tr0B, Tr1B, the first inverter circuit IV0, and the second inverter circuit IV1. The first and second inverter circuits IV0, IV1 are configured so that their inputs and outputs are cross-coupled to each other to form a flip-flop for storing information. The first and second inverter circuits IV0, IV1 are each formed of a PMOS transistor and an NMOS transistor.

In the memory cell MC01, the source-drain path of the transfer NMOS transistor Tr0A is coupled between a bit line ABT0, which is one of an A-port pair of bit lines (ABT0, ABB0), and the input of the first inverter circuit IV0 or the output of the second inverter circuit IV1. The gate electrode of the transfer NMOS transistor Tr0A is coupled to an A-port word line AWLn+1. The source-drain path of the transfer NMOS transistor Tr1A is coupled between a bit line ABB0, which is the other one of the pair of bit lines (ABT0, ABB0), and the output of the first inverter circuit IV0 or the input of the second inverter circuit IV1. The gate electrode of the transfer NMOS transistor Tr1A is coupled to the A-port word line AWLn+1.

In the memory cell MC01, the source-drain path of the transfer NMOS transistor Tr0B is coupled between a bit line BBT1, which is one of a B-port pair of bit lines (BBT1, BBB1), and the input of the first inverter circuit IV0 or the output of the second inverter circuit IV1. The gate electrode of the transfer NMOS transistor Tr0B is coupled to a B-port word line BWLn+1. The source-drain path of the transfer NMOS transistor Tr1B is coupled between a bit line BBB1, which is the other one of the B-port pair of bit lines (BBT1, BBB1), and the output of the first inverter circuit IV0 or the input of the second inverter circuit IV1. The gate electrode of the transfer NMOS transistor Tr1B is coupled to the B-port word line BWLn+1.

Referring to FIG. 10, the memory cell MC00 is coupled to an A-port word line AWLn, a B-port word line BWLn, the A-port pair of bit lines (first bit line pair) ABT0, ABB0, and a B-port pair of bit lines (third bit line pair) BBT0, BBB0.

The memory cell MC01 is coupled to the A-port word line AWLn+1, the B-port word line BWLn+1, the A-port pair of bit lines (first bit line pair) ABT0, ABB0, and the B-port pair of bit lines (fourth bit line pair) BBT1, BBB1.

The memory cell MC02 is coupled to an A-port word line AWLn+2, a B-port word line BWLn+2, an A-port pair of bit lines (second bit line pair) ABT1, ABB1, and a B-port pair of bit lines (fourth bit line pair) BBT1, BBB1.

The memory cell MC03 is coupled to an A-port word line AWLn+3, a B-port word line BWLn+3, the A-port pair of bit lines (second bit line pair) ABT1, ABB1, and the B-port pair of bit lines (third bit line pair) BBT0, BBB0.

The pair of bit lines (first bit line pair) ABT0, ABB0 and the pair of bit lines (second bit line pair) ABT1, ABB1 run parallel to each other. As the bit line ABT0 and the bit line ABT1 run parallel to each other, a parasitic capacitance exists between the bit line ABT0 and the bit line ABT1. Further, as the bit line ABB0 and the bit line ABB1 run parallel to each other, a parasitic capacitance exists between the bit line ABB0 and the bit line ABB1. The pair of bit lines (third bit line pair) BBT0, BBB0 and the pair of bit lines (fourth bit line pair) BBT1, BBB1 run parallel to each other. As the bit line BBT0 and the bit line BBT1 run parallel to each other, a parasitic capacitance exists between the bit line BBT0 and the bit line BBT1. Further, as the bit line BBB0 and the bit line BBB1 run parallel to each other, a parasitic capacitance exists between the bit line BBB0 and the bit line BBB1.

A control circuit 36 for the B port is coupled to B-port pairs of bit lines BBT0, BBB0, BBT1, BBB1. A control circuit for the A port is coupled to A-port pairs of bit lines ABT0, ABB0, ABT1, ABB1. The control circuit 36 for the B port and the control circuit 37 for the A port may be each configured by using the precharge circuit 2a, the column select circuit 3a, the write circuit 4 (the write driver circuit WRD and the first and second write assist circuits NBC0, NBC1), and the readout circuit 5, as depicted in FIG. 3. The precharge circuit 2a, column select circuit 3a, and write circuit 4 (the write driver circuit WRD and the first and second write assist circuits NBC0, NBC1) included in the control circuit 37 for the A port may be regarded as the first precharge circuit 2a, the first column select circuit 3a, and the first write circuit 4 (the first write driver circuit WRD and the first and second write assist circuits NBC0, NBC1). The precharge circuit 2a, column select circuit 3a, and write circuit 4 (the write driver circuit WRD and the write assist circuits NBC0, NBC1) included in the control circuit 36 for the B port may be regarded as the second precharge circuit 2a, the second column select circuit 3a, and the second write circuit 4 (the second write driver circuit WRD and the third and fourth write assist circuits NBC0, NBC1).

Referring to FIG. 10, when the A-port word line AWLn of the memory cell MC00 is selected to write data from an A-port pair of bit lines ABT0, ABB0 to the memory cell MC00, a pair of bit lines ABT1, ABB1 functions as a negative-bias generation capacitance wiring pair (auxiliary line pair). When the B-port word line BWLn of the memory cell MC00 is selected to write data from a B-port pair of bit lines BBT0, BBB0 to the memory cell MC00, a pair of bit lines BBT1, BBB1 functions as a negative-bias generation capacitance wiring pair.

When the A-port word line AWLn+1 of the memory cell MC01 is selected to write data from the A-port pair of bit lines ABT0, ABB0 to the memory cell MC01, the pair of bit lines ABT1, ABB1 functions as a negative-bias generation capacitance wiring pair. When the B-port word line BWLn+1 of the memory cell MC01 is selected to write data from a B-port pair of bit lines BBT1, BBB1 to the memory cell MC01, the pair of bit lines BBT0, BBB0 functions as a negative-bias generation capacitance wiring pair.

When the A-port word line AWLn+2 of the memory cell MC02 is selected to write data from an A-port pair of bit lines ABT1, ABB1 to the memory cell MC02, the pair of bit lines ABT0, ABB0 functions as a negative-bias generation capacitance wiring pair. When the B-port word line BWLn+2 of the memory cell MC02 is selected to write data from the B-port pair of bit lines BBT1, BBB1 to the memory cell MC02, the pair of bit lines BBT0, BBB0 functions as a negative-bias generation capacitance wiring pair.

When the A-port word line AWLn+3 of the memory cell MC03 is selected to write data from the A-port pair of bit lines ABT1, ABB1 to the memory cell MC03, the pair of bit lines ABT0, ABB0 functions as a negative-bias generation capacitance wiring pair. When the B-port word line BWLn+3 of the memory cell MC03 is selected to write data from the B-port pair of bit lines BBT0, BBB0 to the memory cell MC03, the pair of bit lines BBT1, BBB1 functions as a negative-bias generation capacitance wiring pair.

When the word lines (AWLn to AWLn+3, BWLn to BWLn+3) are formed by the first metal wiring layer, the pairs of bit lines (ABT0, ABB0, ABT1, ABB1, BBT0, BBB0, BBT1, BBB1) are formed by the second metal wiring layer in a direction crossing the word lines (AWLn to AWLn+3, BWLn to BWLn+3). When the pairs of bit lines (BT0, BB0, BT1, BB1) are formed by the first metal wiring layer, the word lines (AWLn to AWLn+3, BWLn to BWLn+3) are formed by the second metal wiring layer in a direction crossing the pairs of bit lines (ABT0, ABB0, ABT1, ABB1, BBT0, BBB0, BBT1, BBB1).

Figure 11:
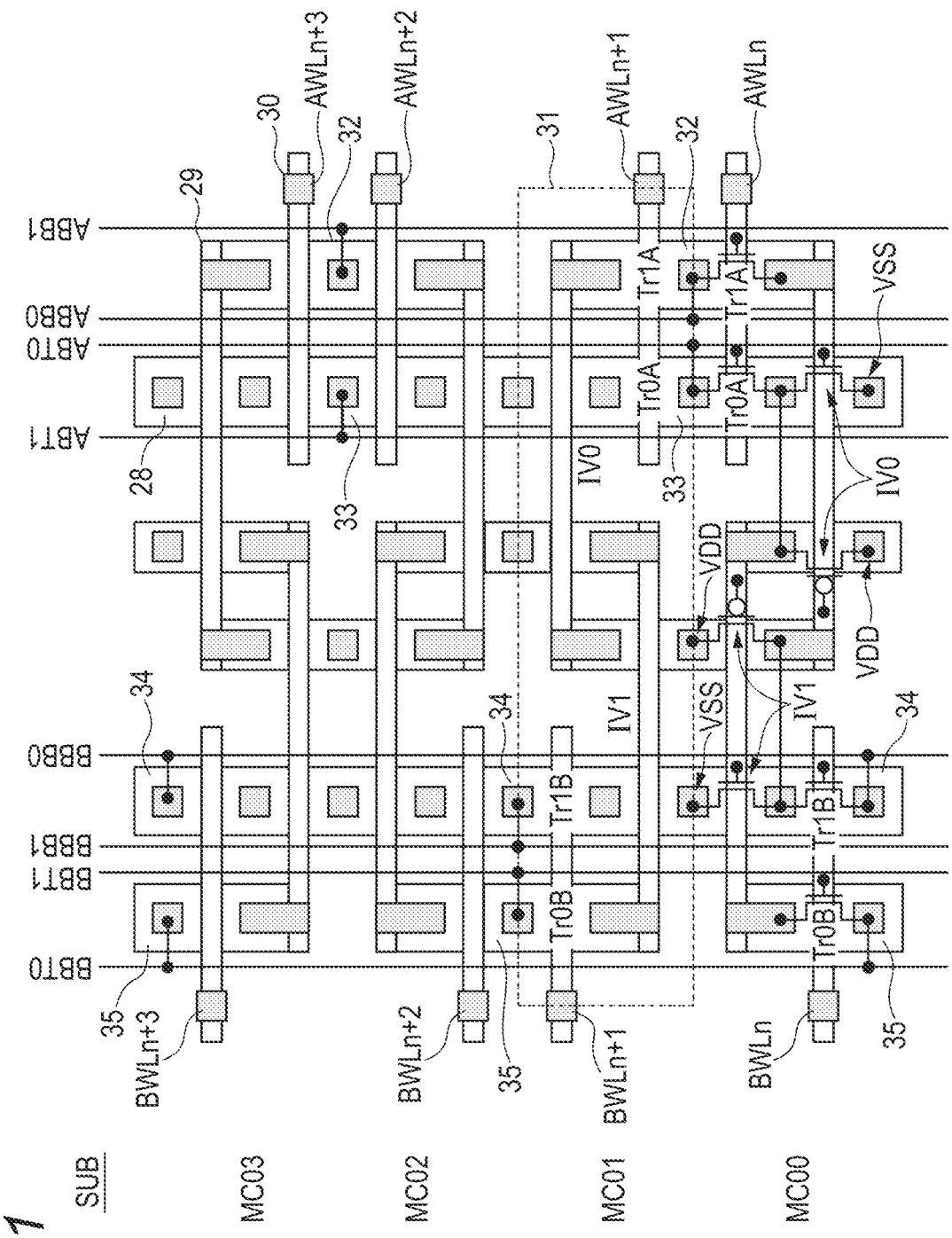
FIG. 11 is a diagram illustrating an exemplary layout of dual-port memory cells used in the semiconductor memory device according to the fourth embodiment.

FIG. 11 is a diagram illustrating an exemplary layout of dual-port memory cells used in the semiconductor memory device according to the fourth embodiment. FIG. 11 illustrates a layout of four dual-port memory cells (MC00, MC01, MC02, MC03) depicted in FIG. 10. In FIG. 11, the reference numeral 28 denotes an N-type or P-type impurity introduction layer, the reference numeral 29 denotes a gate, and the reference numeral 30 denotes a contact. The reference numeral 31 denotes the layout of one memory cell. The reference numerals 32 and 33 denote nodes to which the A-port pairs of bit lines ABT0, ABB0, ABT1, ABB1 are coupled. The reference numerals 34 and 35 denote nodes to which the B-port pairs of bit lines BBT0, BBB0, BBT1, BBB1 are coupled. As regards a memory cell MC00 portion, more detailed coupling relations between transistors included in a dual-port memory cell are depicted.

The memory cells used in the fourth embodiment are dual-port memory cells, which are different from the 6 T SP-SRAM cell described in conjunction with the first, second, and third embodiments. In a dual-port memory cell, a source/drain is shared in the same direction by true bit lines (ABT0, ABT1, BBT0, BBT1) and bar bit lines (ABB0, ABB1, BBB0, BBB1). Therefore, row address changes can be made in units of two cells within a single memory mat.

Figure 12:
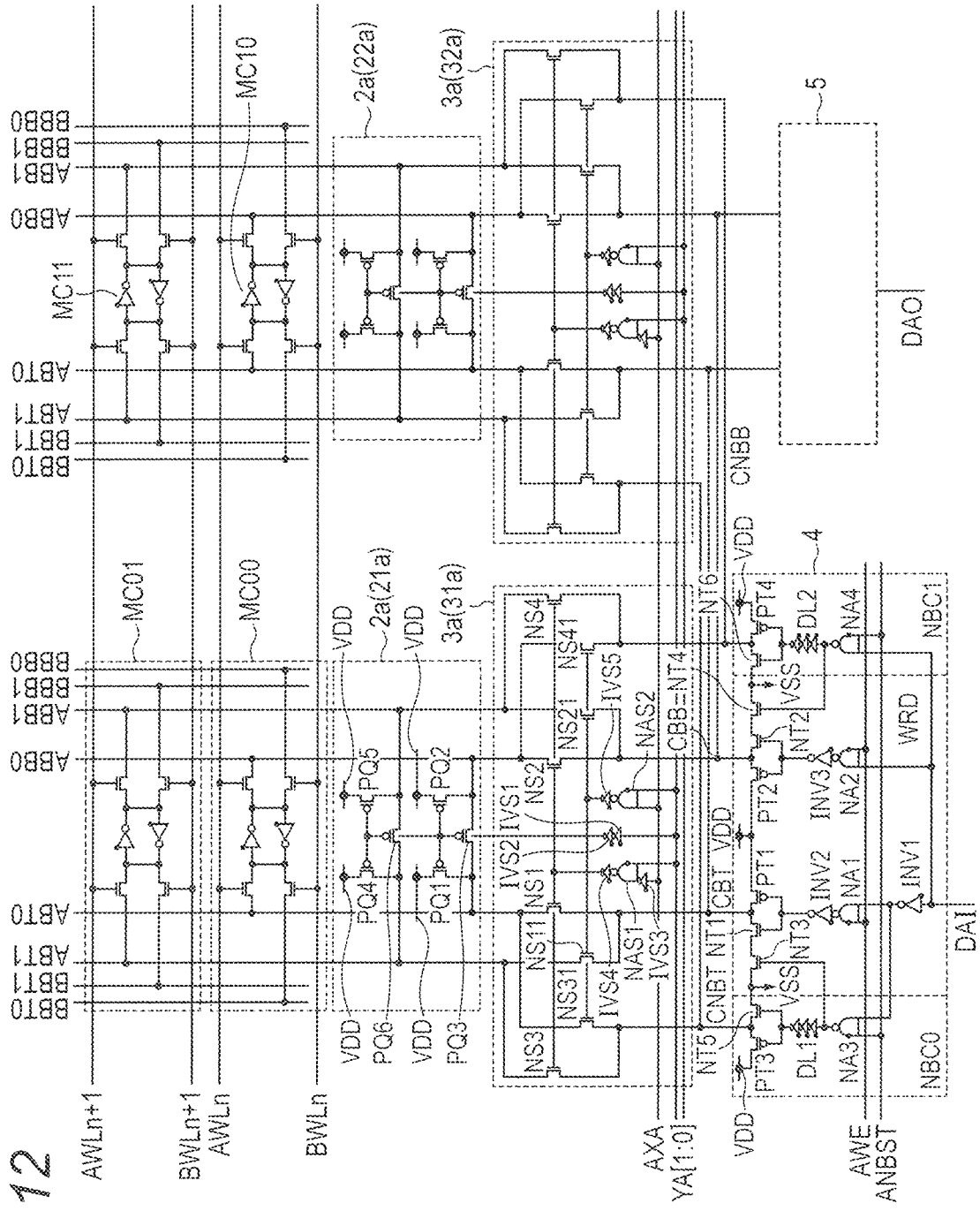
FIG. 12 is a diagram illustrating a circuit configuration of the A port side of the semiconductor memory device according to the fourth embodiment.

FIG. 12 is a diagram illustrating a circuit configuration of the A port side of the semiconductor memory device according to the fourth embodiment. FIG. 12 depicts the first memory column, which is to be selected by the column select signal YA0, and the second memory column, which is to be selected by the column select signal YA1. The first memory column includes dual-port memory cells MC00, MC01, which are depicted as representatives. The second memory column includes dual-port memory cells MC10, MC11, which are depicted as representatives.

The memory cell MC00 (MC10) is coupled to the A-port word line AWLn, the B-port word line BWLn, the A-port pair of bit lines ABT0, ABB0, and the B-port pair of bit lines BBT0, BBB0.

The memory cell MC01 (MC11) is coupled to the A-port word line AWLn+1, the B-port word line BWLn+1, the A-port pair of bit lines ABT1, ABB1, and the B-port pair of bit lines BBT1, BBB1.

The precharge circuit 2a (21a, 22a) is coupled to the A-port pairs of bit lines ABT0, ABB0, ABT1, ABB1 in order to precharge the A-port pairs of bit lines ABT0, ABB0, ABT1, ABB1. The precharge circuit 2a (21a) is controlled by YA0 of the column select signals YA[1:0], and the precharge circuit 2a (22a) is controlled by YA1 of the column select signals YA[1:0]. The circuit configuration of the precharge circuit 2a (21a, 22a) is the same as that of the precharge circuit 2a (21a) and will not be redundantly described.

The column select circuit 3a (31a) couples the first pair of bit lines ABT0, ABB0 for the A port and the second pair of bit lines ABT1, ABB1 for the A port to the write circuit 4 in accordance with the selection level of YA0 of the column select signals YA[1:0] and with the signal level of a row select signal AXA. The column select circuit 3a (32a)

couples the first pair of bit lines ABT0, ABB0 for the A port and the second pair of bit lines ABT1, ABB1 for the A port to the write circuit 4 in accordance with the selection level of YA1 of the column select signals YA[1:0] and with the signal level of the row select signal AXA. The circuit configuration and operation of the column select circuit 3a (31a, 32a) are the same as those of the column select circuit 3a (31a) depicted in FIG. 3 and will not be redundantly described.

The write circuit 4 includes the write driver circuit WRD and the write assist circuits NBC0, NBC1. The write driver circuit WRD supplies data, which is supplied to an A-port data input terminal DAI, to a pair of bit lines (ABT0 and ABB0 or ABT1 and ABB1) selected through the common bit lines CBT, CBB. The write assist circuits NBC0, NBC1 are coupled through the pair of common auxiliary lines CNBT, CNBB to an unselected pair of bit lines (ABT1 and ABB1 or ABT0 and ABB0) that run parallel to a selected bit line pair. The write assist circuits NBC0, NBC1 are provided so that the potential of an unselected bit line (ABT1, ABB1, ABT0, or ABB0) running parallel to a bit line (ABT0, ABB0, ABT1, or ABB1) that is one of a selected pair of bit lines and placed at the low level based on the data input terminal DAI is changed from the first reference potential VDD to the second reference potential VSS. The circuit configuration and operation of the write circuit 4 (the write driver circuit WRD and the write assist circuits NBC0, NBC1) are the same as those of the write circuit 4 (the write driver circuit WRD and the write assist circuits NBC0, NBC1) depicted in FIG. 3 and will not be redundantly described.

The readout circuit 5 is coupled to the pair of common bit lines CBT, CBB, receives data of a memory cell selected by a word line (AWLn or AWLn+1) through a pair of bit lines (ABT0 and ABB0 or ABT1 and ABB1) selected by the column select signals YA[1:0] and the pair of common bit lines CBT, CBB, amplifies the received data, and outputs the amplified data to an data output terminal DAC.

The B-port side circuit configuration of the semiconductor memory device according to the fourth embodiment is easily understood by those skilled in the art when they reference the A-port side circuit configuration. Therefore, the illustration and explanation of the B-port side circuit configuration are omitted.

Even when dual-port memory cells are used, the fourth embodiment makes it possible to use an unused bit line pair as an auxiliary line pair. Therefore, the fourth embodiment provides the same advantageous effects as the first, second, ad third embodiments.

Application Example

Figure 13:
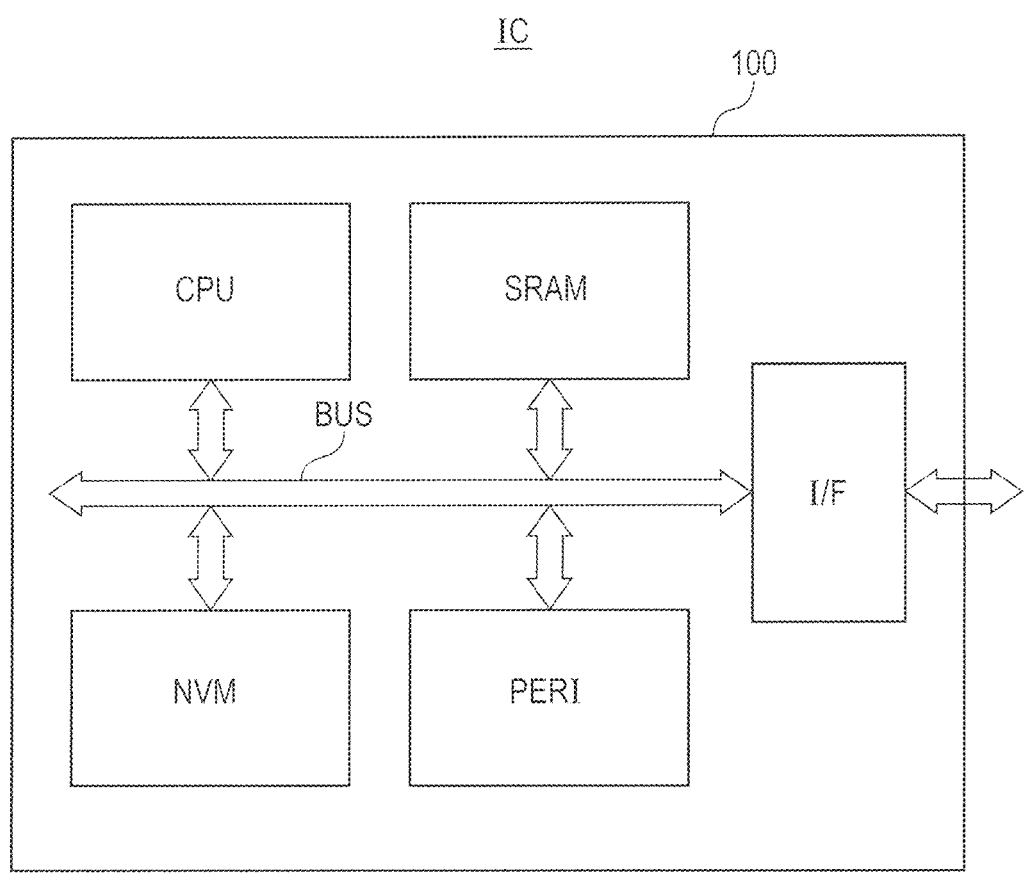
FIG. 13 is a block diagram illustrating a configuration of a semiconductor device according to an application example.

FIG. 13 is a block diagram illustrating a configuration of a semiconductor device according to an application example. FIG. 13 depicts a microcomputer that is an example of a semiconductor device IC. The semiconductor device IC, which is a single semiconductor chip 100 like single crystal silicon, includes a central processing unit CPU, a volatile semiconductor memory device SRAM, a nonvolatile memory device NVM such as a flash memory, a peripheral circuit PERI, an interface circuit I/F, and a data bus BUS interconnecting these devices. The volatile semiconductor memory device SRAM is used as a storage area for storing temporary data of the central processing unit CPU. The nonvolatile memory device NVM is used as a storage area for storing a control program that is to be executed by the central processing unit CPU.

One or more of the semiconductor memory devices 1, 1a, 1b, 1c, 1d described in conjunction with the first, second, third, or fourth embodiment may be used as the volatile semiconductor memory device SRAM.

The row select signals XA[0]-XA[3] described in conjunction with the third embodiment are internal address signals in the volatile semiconductor memory device SRAM. Address signals to be outputted from the central processing unit CPU may be formed, for example, of two low-order bits of a row select signal that is an address signal indicative of the volatile semiconductor memory device SRAM.

While the present invention contemplated by its inventors has been described in detail in terms of particular embodiments, the present invention is not limited to the foregoing embodiments and examples. It is to be understood by those skilled in the art that various modifications can be made without departing from the spirit and scope of the present invention.

What is claimed is:

1. A semiconductor memory device comprising:
a plurality of word lines;
a plurality of bit line pairs;
a plurality of memory cells that are coupled to the word lines and the bit line pairs in such a manner that one memory cell is coupled to one word line and one bit line pair;
a plurality of auxiliary line pairs that run parallel to the bit line pairs in such a manner that one auxiliary line pair runs parallel to one bit line pair;
a write driver circuit;
a write assist circuit; and
a select circuit that couples, to the write driver circuit, one bit line pair selected from the bit line pairs in accordance with a select signal, and couples, to the write assist circuit, an associated auxiliary line pair running parallel to the selected bit line pair,
wherein the write driver circuit causes one bit line of the selected bit line pair to transition from a high level to a low level in accordance with input data,
wherein the write assist circuit causes one auxiliary line of the associated auxiliary line pair to transition from a high level to a low level, the one auxiliary line of the associated auxiliary line pair being disposed in association with the one bit line placed at the low level,
wherein, when the one auxiliary line is transitioned from the high level to the low level, the one bit line transitioned to the low level is placed in a high-impedance state, and
wherein the one bit line transitions from the low level to a negative potential in accordance with the transition of the one auxiliary line from the high level to the low level.

2. A semiconductor memory device comprising:
a first memory cell;
a second memory cell;
a first bit line pair that is coupled to the first memory cell;
a second bit line pair that is coupled to the second memory cell and disposed to run parallel to the first bit line pair;
a write driver circuit;
a write assist circuit; and
a select circuit,
wherein, in accordance with a select signal, when the select circuit couples the first bit line pair to the write driver circuit and couples the second bit line pair to the write assist circuit:

the write driver circuit causes one bit line of the first bit line pair to transition from a high level to the a low level in accordance with input data; and the write assist circuit causes one bit line of the second bit line pair to transition from a high level to a low level, the one bit line of the second bit line pair being disposed in association with the one bit line of the first bit line pair, the one bit line of the first bit line pair being placed at the low level, wherein, when the one bit line of the second bit line pair is transitioned from the high level to the low level, the one bit line transitioned to the low level is placed in a high-impedance state, and wherein the one bit line of the first bit line pair transitions from the low level to a negative potential in accordance with the transition of the one bit line of the second bit line pair from the high level to the low level.

3. The semiconductor memory device according to claim 2, wherein, in accordance with the select signal, when the select circuit couples the second bit line pair to the write driver circuit and couples the first bit line pair to the write assist circuit:

the write driver circuit causes one bit line of the second bit line pair to transition from a high level to a low level in accordance with input data; and the write assist circuit causes one bit line of the first bit line pair to transition from a high level to a low level, the one bit line of the first bit line pair being disposed in association with the one bit line of the second bit line pair, the one bit line of the second bit line pair being placed at the low level.

4. The semiconductor memory device according to claim 3, wherein, when the one bit line of the first bit line pair is transitioned from the high level to the low level, the one bit line of the second bit line pair is placed in a high-impedance state, the one bit line of the second bit line pair being placed at the low level, and wherein the one bit line of the second bit line pair transitions from the low level to a negative potential in accordance with the transition of the one bit line of the first bit line pair from the high level to the low level.

5. The semiconductor memory device according to claim 3, further comprising:

a third memory cell; and a fourth memory cell, wherein the first bit line pair includes the one bit line and the other bit line, wherein the second bit line pair includes the one bit line and the other bit line, wherein the third memory cell is coupled to the one bit line of the first bit line pair and the other bit line of the second bit line pair, wherein the fourth memory cell is coupled to the one bit line of the second bit line pair and the other bit line of the first bit line pair, and wherein, in accordance with the select signal, the select circuit either couples the one bit line of the first bit line pair and the other bit line of the second bit line pair to the write driver circuit and couples the one bit line of the second bit line pair and the other bit line of the first bit line pair to the write assist circuit, or couples the one bit line of the second bit line pair and the other bit line of the first bit line pair to the write driver circuit and couples the one bit line of the first bit line pair and the other bit line of the second bit line pair to the write assist circuit.

6. The semiconductor memory device according to claim 5, wherein the first memory cell, the second memory cell, the third memory cell, and the fourth memory cell are disposed in the order of the first memory cell, the third memory cell, the second memory cell, the fourth memory cell, wherein a coupling section between the first memory cell and the other bit line of the second bit line pair and a coupling section between the third memory cell and the one bit line of the first bit line pair are formed of one impurity introduction layer, wherein a coupling section between the third memory cell and the other bit line of the second bit line pair and a coupling section between the second memory cell and the other bit line of the second bit line pair are formed of one impurity introduction layer, and wherein a coupling section between the second memory cell and the one bit line of the second bit line pair and a coupling section between the fourth memory cell and the one bit line of the second bit line pair are formed of one impurity introduction layer.

7. The semiconductor memory device according to claim 2, further comprising:

a semiconductor substrate, wherein a surface of the semiconductor substrate includes two P-type well regions and an N-type well region, the N-type well region being disposed between the two P-type well regions, wherein the first memory cell and the second memory cell are formed in the two P-type well regions and the N-type well region, and wherein the surface of the semiconductor substrate includes a power feed region for the two P-type well regions and the N-type well region, the power feed region being disposed between a region forming the first memory cell and a region forming the second memory cell.

8. The semiconductor memory device according to claim 2, further comprising:

a semiconductor substrate, wherein a surface of the semiconductor substrate includes a region forming the first memory cell, a region forming the second memory cell, and an input/output region, and wherein the input/output region is disposed between the region forming the first memory cell and the region forming the second memory cell.

9. A semiconductor memory device comprising:

a first memory cell and a second memory cell that each includes a first port and a second port;

a first bit line pair that is coupled to the first port of the first memory cell;

a second bit line pair that is coupled to the first port of the second memory cell and disposed to run parallel to the first bit line pair;

a third bit line pair that is coupled to the second port of the first memory cell;

a fourth bit line pair that is coupled to the second port of the second memory cell and disposed to run parallel to the third bit line pair;
a first write circuit; and
a first select circuit,
wherein the first write circuit includes:
   a write driver circuit; and
   a write assist circuit, and
wherein, in accordance with a select signal, when the first select circuit couples the first bit line pair to the write driver circuit of the first write circuit and couples the second bit line pair to the write assist circuit of the first write circuit,
wherein the semiconductor memory device further includes:
   a second write circuit; and
   a second select circuit,
wherein the second write circuit includes:
   a write driver circuit; and
   a write assist circuit,
wherein, in accordance with the select signal, when the second select circuit couples the third bit line pair to the write driver circuit of the second write circuit and couples the fourth bit line pair to the write assist circuit of the second write circuit,
wherein the write driver circuit of the first write circuit causes one bit line of the first bit line pair to transition from a high level to a low level in accordance with input data, and
wherein the write assist circuit of the first write circuit causes one bit line of the second bit line pair to transition from a high level to a low level, the one bit line of the second bit line pair being disposed in association with the one bit line of the first bit line pair, the one bit line of the first bit line pair being placed at the low level, wherein, when the one bit line of the second bit line pair is transitioned from the high level to the low level, the one bit line transitioned to the low level is placed in a high-impedance state, and
wherein the one bit line of the first bit line pair transitions from the low level to a negative potential in accordance with the transition of the one bit line of the second bit line pair from the high level to the low level.

10. The semiconductor memory device according to claim 9,
wherein, in accordance with the select signal, when the first select circuit couples the second bit line pair to the write driver circuit of the first write circuit and couples the first bit line pair to the write assist circuit of the first write circuit:
the write driver circuit of the first write circuit causes one bit line of the second bit line pair to transition from a high level to a low level in accordance with input data; and
the write assist circuit of the first write circuit causes one bit line of the first bit line pair to transition from a high level to a low level, the one bit line of the first bit line pair being disposed in association with the one bit line of the second bit line pair, the one bit line of the second bit line pair being placed at the low level.

11. The semiconductor memory device according to claim 10,
wherein, when the one bit line of the first bit line pair is transitioned from the high level to the low level, the one bit line transitioned to the low level is placed in a high-impedance state, and
wherein the one bit line of the second bit line pair transitions from the low level to a negative potential in accordance with the transition of the one bit line of the first bit line pair from the high level to the low level.

* * * * *